(12) United States Patent
Fujikane et al.

(10) Patent No.: US 8,841,220 B2
(45) Date of Patent: Sep. 23, 2014

(54) GALLIUM NITRIDE BASED SEMICONDUCTOR LIGHT-EMITTING ELEMENT, LIGHT SOURCE, AND METHOD FOR FORMING UNEVENNESS STRUCTURE

(71) Applicant: Panasonic Corporation, Osaka (JP)

(72) Inventors: Masaki Fujikane, Osaka (JP); Akira Inoue, Osaka (JP); Toshiya Yokogawa, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/892,637

(22) Filed: May 13, 2013

(65) Prior Publication Data

US 2013/0248877 A1 Sep. 26, 2013

Related U.S. Application Data

(63) Continuation of application No. PCT/JP2012/003104, filed on May 11, 2012.

(30) Foreign Application Priority Data

Jun. 24, 2011 (JP) .................................. 2011-140876

(51) Int. Cl.
| | | |
|---|---|---|
| H01L 21/311 | (2006.01) | |
| H01L 21/302 | (2006.01) | |
| H01L 33/58 | (2010.01) | |
| H01L 33/32 | (2010.01) | |
| H01L 33/22 | (2010.01) | |
| H01L 33/42 | (2010.01) | |
| H01L 33/16 | (2010.01) | |

(52) U.S. Cl.
CPC ................ *H01L 33/32* (2013.01); *H01L 33/58* (2013.01); *H01L 33/42* (2013.01); *H01L 33/22* (2013.01); *H01L 33/16* (2013.01)
USPC ........................................................ 438/718

(58) Field of Classification Search
CPC ......... H01L 33/42; H01L 33/22; H01L 33/16; H01L 33/32; H01L 33/58
USPC ....................................................... 438/718
See application file for complete search history.

(56) References Cited

U.S. PATENT DOCUMENTS 8,247,822 B2 *  8/2012  Cheng et al. ................... 257/79
8,337,798 B2 * 12/2012  Sarayama et al. ............ 423/409

(Continued)

FOREIGN PATENT DOCUMENTS

| JP | 2009-094219 A | 4/2009 |
| JP | 2009-225787 A | 10/2009 |

(Continued)

OTHER PUBLICATIONS

International Search Report for corresponding International Application No. PCT/JP2012/003104 mailed Aug. 7, 2012.

(Continued)

*Primary Examiner* — William D Coleman
(74) *Attorney, Agent, or Firm* — Renner, Otto, Boisselle & Sklar, LLP

(57) ABSTRACT

The light extraction surface of a nitride semiconductor light-emitting element, including a crystal plane other than a c plane, is subjected to a surface modification process to control its wettability, and then covered with a layer of fine particles. By etching that layer of fine particles after that, an unevenness structure, in which roughness curve elements have an average length (RSm) of 150 nm to 800 nm, is formed on the light extraction surface.

12 Claims, 24 Drawing Sheets

(56) References Cited

U.S. PATENT DOCUMENTS

| | | |
|---|---|---|
| 2003/0173568 A1 | 9/2003 | Asakawa et al. |
| 2003/0213964 A1* | 11/2003 | Flynn et al. .................... 257/85 |
| 2005/0179130 A1* | 8/2005 | Tanaka et al. ................. 257/730 |
| 2008/0149952 A1 | 6/2008 | Kasahara et al. |
| 2008/0258156 A1 | 10/2008 | Hata |
| 2008/0303042 A1* | 12/2008 | Minato et al. ................... 257/98 |
| 2009/0114944 A1 | 5/2009 | Ono et al. |
| 2009/0278158 A1 | 11/2009 | Fukunaga et al. |
| 2009/0283800 A1 | 11/2009 | Im et al. |
| 2011/0012150 A1 | 1/2011 | Kim et al. |
| 2012/0113656 A1 | 5/2012 | Iwanaga et al. |

FOREIGN PATENT DOCUMENTS

| | | |
|---|---|---|
| JP | 2009-302578 A | 12/2009 |
| WO | 2006/088228 A1 | 8/2006 |
| WO | 2007/069651 A1 | 6/2007 |
| WO | 2011/010436 A1 | 1/2011 |

OTHER PUBLICATIONS

Form PCT/ISA/237 for corresponding International Application No. PCT/JP2012/003104 dated Aug. 7, 2012.

* cited by examiner

FIG.1
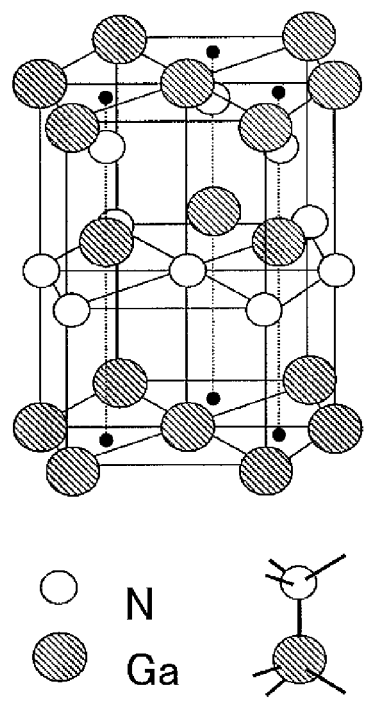
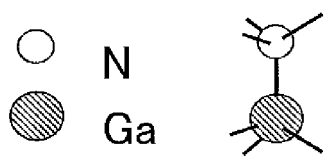
FIG.2
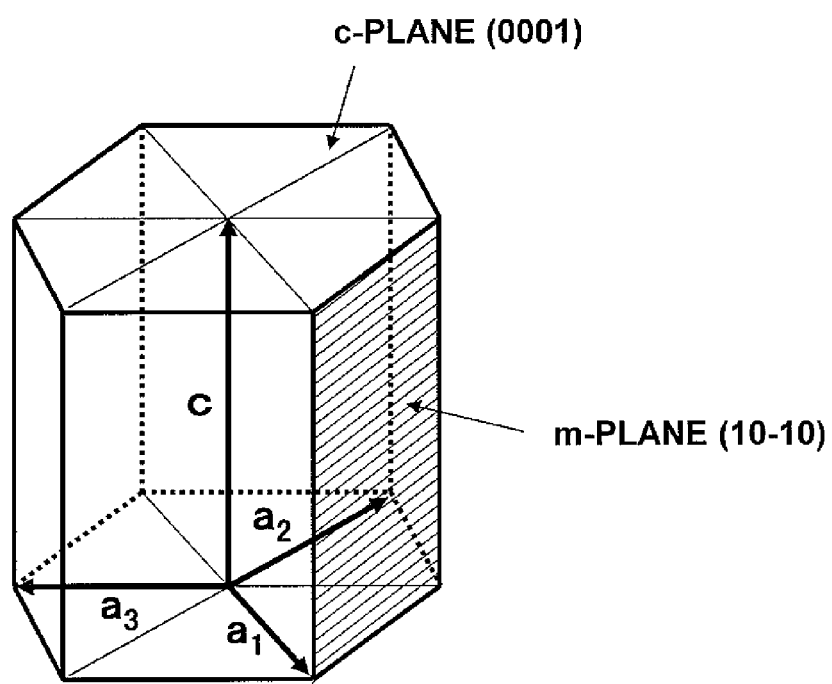

(0001) c PLANE c AXIS (10−10) m PLANE c AXIS (11−20) a PLANE c AXIS (−1012) r PLANE c AXIS

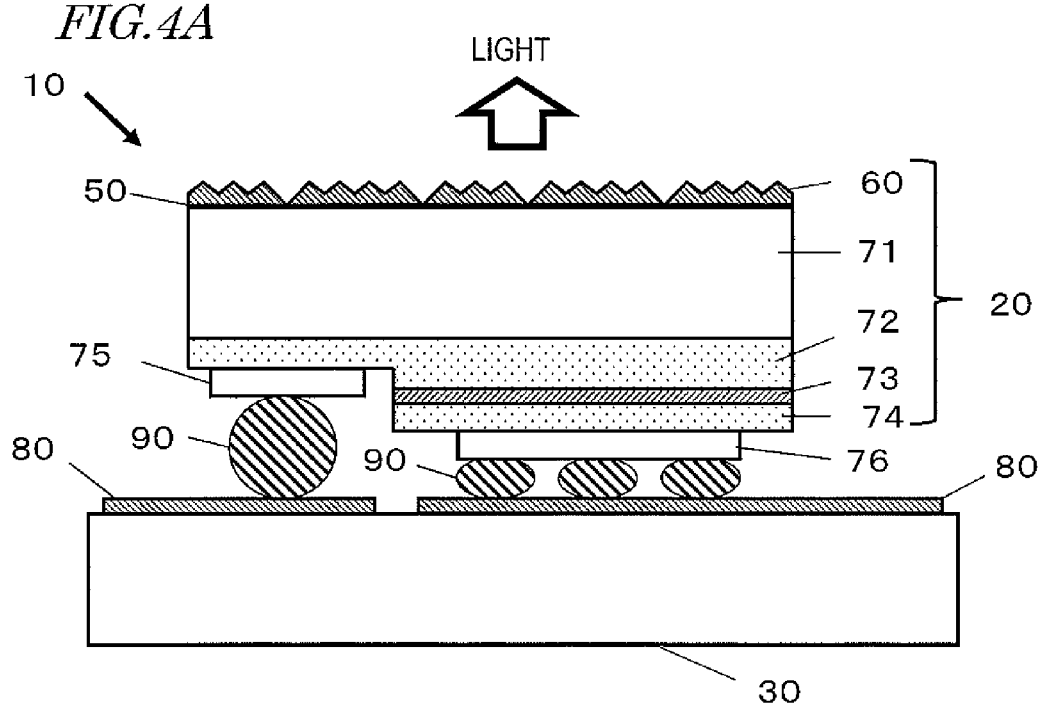
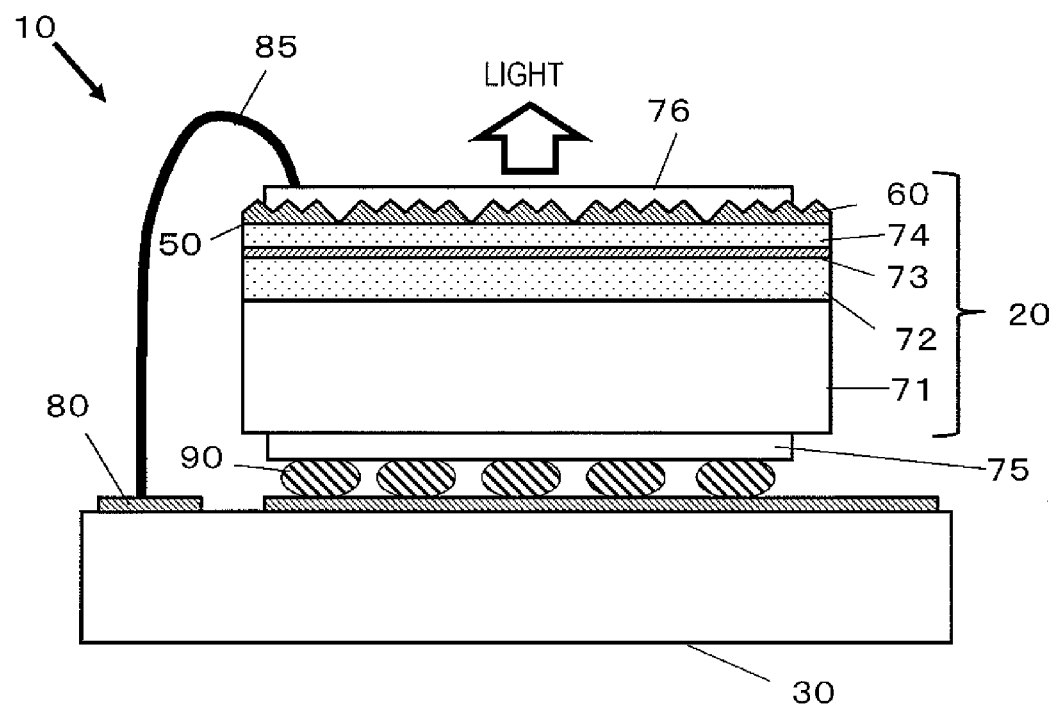

GALLIUM NITRIDE BASED SEMICONDUCTOR LIGHT-EMITTING ELEMENT, LIGHT SOURCE, AND METHOD FOR FORMING UNEVENNESS STRUCTURE

This is a continuation of International Application No. PCT/JP2012/003104, with an international filing date of May 11, 2012, which claims priority of Japanese Patent Application No. 2011-140876, filed on Jun. 24, 2011, the contents of which are hereby incorporated by reference.

BACKGROUND

1. Technical Field

The present application relates to a GaN-based semiconductor light-emitting element such as a light-emitting diode or a laser diode.

2. Description of the Related Art

A nitride semiconductor including nitrogen (N) as a Group V element is a prime candidate for a material to make a short-wave light-emitting element, because its bandgap is sufficiently wide. Among other things, gallium nitride-based compound semiconductors including Ga as a Group III element (which will be referred to herein as "GaN-based semiconductors" and which are represented by the formula $Al_xGa_yIn_zN$ (where $0 \le x, y, z \le 1$ and $x+y+z=1$)) have been researched and developed particularly extensively. As a result, blue-ray-emitting light-emitting diodes (LEDs), green-ray-emitting LEDs and semiconductor laser diodes made of GaN-based semiconductors have already been used in actual products.

A GaN-based semiconductor has a wurtzite crystal structure. FIG. 1 schematically illustrates a unit cell of GaN. In an $Al_xGa_yIn_zN$ (where $0 \le x, y, z \le 1$ and $x+y+z=1$) semiconductor crystal, some of the Ga atoms shown in FIG. 1 may be replaced with Al and/or In atoms.

FIG. 2 shows four primitive vectors $a_1$, $a_2$, $a_3$ and c of a wurtzite crystal structure. The primitive vector c runs in the [0001] direction, which is called a "c axis". A plane that intersects with the c axis at right angles is called either a "c plane" or a "(0001) plane". Furthermore, a plane which is terminated with a Group III element such as Ga is called either a "+c plane" or a "(0001) plane", while a plane which is terminated with a Group V element such as nitrogen is called either a "−c plane" or a "(000-1) plane". That is to say, these two crystal planes are dealt with as different ones. It should be noted that the "c axis" and the "c plane" are sometimes referred to as "C axis" and "C plane".

In fabricating a semiconductor element using GaN-based semiconductors, a c-plane substrate, i.e., a substrate of which the principal surface is a (0001) plane, is used as a substrate on which GaN semiconductor crystals will be grown. In a c plane, however, Ga atoms and nitrogen atoms do not exist on the same atomic plane, thus producing electrical polarization there. That is why the c plane is also called a "polar plane". As a result of the electrical polarization, a piezoelectric field is generated in the InGaN quantum well of the active layer in the c-axis direction. Once such a piezoelectric field has been generated in the active layer, some positional deviation occurs in the distributions of electrons and holes in the active layer due to the quantum confinement Stark effect of carriers. Consequently, the internal quantum efficiency decreases, thus increasing the threshold current in a semiconductor laser diode and increasing the power consumption and decreasing the luminous efficiency in an LED. Meanwhile, as the density of injected carriers increases, the piezoelectric field is screened, thus varying the emission wavelength, too.

Thus, to overcome these problems, it has been proposed that a substrate, of which the principal surface is a non-polar plane such as a (10-10) plane that is perpendicular to the [10-10] direction and that is called an "m plane", be used (i.e., an m-plane GaN substrate be used). In this description, "−" attached on the left-hand side of a Miller-Bravais index in the parentheses means a "bar" (a negative direction index). As shown in FIG. 2, the m plane is parallel to the c axis and intersects with the c plane at right angles. On the m plane, Ga atoms and nitrogen atoms are on the same atomic plane. For that reason, no spontaneous electrical polarization will be produced perpendicularly to the m plane. That is why if a semiconductor multilayer structure is formed perpendicularly to the m plane, no piezoelectric field will be generated in the active layer, thus overcoming the problems described above. In this case, the "m plane" is a generic term that collectively refers to a family of planes including (10-10), (−1010), (1-100), (−1100), (01-10) and (0-110) planes.

In this description, the "a plane" refers herein to a (11-20) plane, which intersects with the [11-20] direction at right angles. As shown in FIG. 3C, the a plane is parallel to the c axis (i.e., the primitive vector c) and intersects with the c plane at right angles. In this case, the "a plane" is a generic term that collectively refers to a family of planes including (11-20), (−1-120), (1-210), (−12-10), (−2110) and (2-1-10) planes.

In this description, the "+r plane" refers herein to a (10-12) plane, which intersects with the [10-12] direction at right angles. The r plane is shown in FIG. 3D. In this case, the "+r plane" is a generic term that collectively refers to a family of planes including (10-12), (−1012), (1-102), (−1102), (01-12) and (0-112) planes.

In this description, the "−r plane" refers herein to a (10-1-2) plane, which intersects with the [10-1-2] direction at right angles. In this case, the "−r plane" is a generic term that collectively refers to a family of planes including (10-1-2), (−101-2), (1-10-2), (−110-2), (01-1-2) and (0-11-2) planes.

Meanwhile, some people devised a method for transferring the nanostructure of a film onto the surface of a semiconductor light-emitting element by covering the surface of the semiconductor light-emitting element with such a film and dry-etching the surface using that film as a photolithographic mask. For example, Japanese Laid-Open Patent Publication No. 2009-94219 discloses a method for transferring a nanostructure using nanoparticles as an etching mask. Japanese Laid-Open Patent Publication No. 2009-302578 discloses a method for transferring a nanostructure using block copolymers as an etching mask. And Japanese Laid-Open Patent Publication No. 2009-225787 discloses a method for transferring a nanostructure using metallic nanoparticles as an etching mask.

SUMMARY

The prior art technique needs further improvement in view of the quality of the light emitted.

One non-limiting, and exemplary embodiment provides a technique to improve the quality of the light emitted.

In one general aspect, a gallium nitride based semiconductor light-emitting element disclosed herein includes: a semiconductor multilayer structure which is made of a gallium nitride based semiconductor and which includes an active layer that produces polarized light; and an electrode structure which contacts with the semiconductor multilayer structure and which injects carriers into the active layer. The semiconductor multilayer structure has a light extraction surface on which an unevenness structure has been formed on at least a part of a crystal plane other than a c plane. The unevenness structure has projections which are arranged on the crystal plane and each of which has a shape that is not axisymmetric with respect to a normal line to the light extraction surface. And roughness curve elements of the unevenness structure have an average length (RSm) of 150 nm to 800 nm.

According to the above aspect, the light extraction surface is given a nanostructure, and therefore, the quality of the light emitted can be improved.

These general and specific aspects may be implemented using a method. Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

BRIEF DESCRIPTION OF THE DRAWINGS

FIG. 1 is a perspective view schematically illustrating a unit cell of GaN.

FIG. 2 is a perspective view showing the four primitive translation vectors $a_1$, $a_2$, $a_3$ and c of a wurtzite crystal structure.

FIG. 4A is a cross-sectional view illustrating an example in which a gallium nitride based semiconductor light-emitting element as an exemplary embodiment of the present disclosure has been mounted facedown.

FIG. 4B is a cross-sectional view illustrating an example in which a gallium nitride based semiconductor light-emitting element as an exemplary embodiment of the present disclosure has been mounted face-up.

DETAILED DESCRIPTION

Figure 3A:
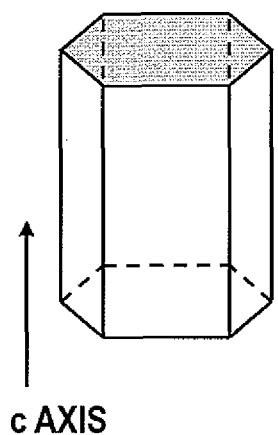
FIGS. 3A through 3D are schematic representations illustrating representative crystallographic plane orientations of a hexagonal wurtzite structure.
Figure 3B:
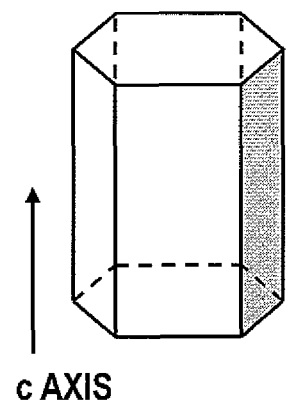
Figure 3C:
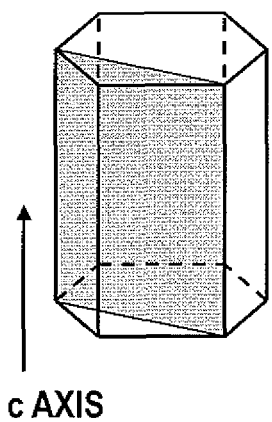
Figure 3D:
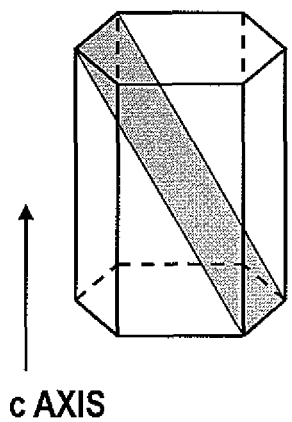

A gallium nitride based semiconductor light-emitting element, of which the principal surface is a non-polar plane such as an m plane or a semi-polar plane, emits polarized light. If such an light-emitting element that emits polarized light is used as a light source, the quantity of the light reflected from an object changes, and the object looks differently, according to the direction of the polarized light (i.e., the direction in which the light-emitting element is arranged). This is because the reflectance changes depending on whether the polarized light is P polarized or S polarized (specifically, S polarized light has a higher reflectance than the P polarized light). That is why in an application in which the polarization property is used as it is, it is important to increase the degree of polarization. However, when such polarized light is used for general illumination purposes, the performance will decline.

Furthermore, light travels perpendicularly to its polarization direction by nature. That is why if the light produced by a gallium nitride based semiconductor light-emitting element is polarized, then the luminous intensity distribution of the light emitted from the element will be different from that of a shape defined by the Lambert's cosine law (which is called a "Lambertian distribution").

Such a problem arises particularly noticeably in a gallium nitride based light-emitting element, of which the principal surface is a non-polar plane or a semi-polar plane, and constitutes a major obstacle to using such a light-emitting element, of which the principal surface is a non-polar plane or a semi-polar plane, in actual products.

Thus, to increase the light extraction efficiency, a nanostructure could be formed on the surface of a gallium nitride based light-emitting element. Such a nanostructure could be formed on a traditional gallium nitride based light-emitting element, of which the principal crystal growing plane is a c plane, because its −c (000-1) plane that is terminated with a Group V element such as nitrogen is chemically active (i.e., not stabilized) and selectively soluble when subjected to a wet etching process in an acidic aqueous solution such as KOH. However, a gallium nitride based light-emitting element, of which the principal crystal growing plane is an m plane, does not have such a selectively soluble crystal plane, and therefore, the traditional technique using the acidic aqueous solution cannot be applied to such an element.

That is why to form a nanostructure on the surface of such an m-plane-growing gallium nitride light-emitting element, a dry etching technique could be applied after the element has been subjected to a photolithographic process. To form such a nanostructure in the visible radiation wavelength range, however, either a very expensive immersion exposure apparatus or extreme ultraviolet (EUV) exposure apparatus should be used. Alternatively an electron beam (EB) exposure system, with which it would take a very long manufacturing process time, should be used. None of these exposure apparatuses are suitable for mass production.

The present inventors discovered the following problems. A nitride semiconductor light-emitting element, of which the principal surface is a non-polar plane such as an m plane or a semi-polar plane, would emit polarized light as described above. The nitride semiconductor light-emitting element would have a different luminous intensity distribution from the Lambertian one. The nitride semiconductor light-emitting element should have its light extraction efficiency increased.

A gallium nitride based semiconductor light-emitting element according to the present disclosure includes: a semiconductor multilayer structure which is made of a gallium nitride based semiconductor and which includes an active layer that produces polarized light; and an electrode structure which contacts with the semiconductor multilayer structure and which injects carriers into the active layer. The semiconductor multilayer structure has a light extraction surface on which an unevenness structure has been formed on at least a part of a crystal plane other than a c plane. The unevenness structure has projections which are arranged on the crystal plane and each of which has a shape that is not axisymmetric with respect to a normal line to the light extraction surface. And roughness curve elements of the unevenness structure have an average length (RSm) of 150 nm to 800 nm.

In one embodiment, the projections each have a plane that defines an angle of more than 0 degrees but less than 90 degrees with respect to the polarization direction of the polarized light.

In another embodiment, the unevenness structure includes projections having an irregular shape.

In still another embodiment, the unevenness structure includes projections which have been formed at irregular positions on the crystal plane.

In yet another embodiment, the semiconductor multilayer structure includes a gallium nitride based semiconductor substrate that has the light extraction surface.

In yet another embodiment, the density of the projections included in the unevenness structure falls within the range of 1 projection per $\mu m^2$ through 50 projections per $\mu m^2$.

In a specific embodiment, the semiconductor multilayer structure includes: first and second conductive regions which have been formed on the substrate and which are made of gallium nitride based semiconductors that sandwich the active layer between them; a first electrode which contacts with the first conductive region; and a second electrode which contacts with the second conductive region. Light that has been emitted from the active layer is extracted to an external space mainly through the light extraction surface.

In yet another embodiment, the roughness curve elements of the unevenness structure have an average length (RSm) of 150 nm to 400 nm.

In yet another embodiment, the unevenness structure has an arithmetic mean roughness (Ra) of 10 nm to 800 nm.

In a specific embodiment, the projections that form the unevenness structure have a triangular pyramid shape, substantially triangular pyramid shape, or a combination thereof.

In yet another embodiment, at least some of the projections of the unevenness structure have their tip topped having a different material from the rest of the unevenness structure.

In yet another embodiment, the crystal plane other than the c plane is a plane that defines a tilt angle of 18 to 90 degrees with respect to the c plane.

In a specific embodiment, the crystal plane other than the c plane is an m plane, an a plane, a +r plane or a −r plane.

In yet another embodiment, the substrate is an m-plane GaN substrate.

A light source according to an embodiment of the present disclosure includes a gallium nitride based semiconductor light-emitting element according to any of the embodiments described above; and a wavelength changing section which has a phosphor to change the wavelength of the light that has been emitted from the active layer.

A method for forming an unevenness structure according to an embodiment of the present disclosure includes the steps of: (S0) providing a gallium nitride based semiconductor, of which the surface is a crystal plane other than a c plane; (S1) modifying the surface after the step (S0) has been performed; (S2) arranging a plurality of particles on the modified surface after the step (S1) has been performed; and (S3) forming an unevenness structure in at least a part of a crystal plane of the gallium nitride based semiconductor other than a c plane by dry-etching the surface after the step (S2) has been performed. Roughness curve elements of the unevenness structure have an average length (RSm) of 150 nm to 800 nm.

In one embodiment, the step (S2) includes the steps of: (S2A) dipping the gallium nitride based semiconductor in a solution including the particles; and (S2B) pulling up the gallium nitride based semiconductor from the solution after the step (S2A) has been performed.

In this particular embodiment, the solution used in the step (S2) is hydrophilic.

In another embodiment, the solution used in the step (S2) is at least one selected from the group consisting water, methanol, ethanol, phenol, ethylene glycol, and acetic acid.

In still another embodiment, the step (S1) includes exposing the crystal plane other than the c plane to an atmosphere including oxygen atoms to oxidize the crystal plane other than the c plane.

In yet another embodiment, at least the surface of the particles used in the step (S2) is hydrophilic.

In a specific embodiment, the particles used in the step (S2) are made of at least one selected from the group consisting of $SiO_2$, $TiO_2$, ZnO, Au, Ag, polystyrene, a benzoguanamine-melamine-formaldehyde condensate and cross-linked polymethylmethacrylate.

Hereinafter, embodiments of the present disclosure will be described with reference to the accompanying drawings.

Embodiment 1

First of all, a first embodiment of a gallium nitride based semiconductor light-emitting element according to the present disclosure will be described with reference to FIGS. 4A and 4B.

A gallium nitride (GaN) based semiconductor light-emitting element 10 according to this embodiment includes a semiconductor multilayer structure 20, including an active layer 73 which produces polarized light, and electrode structures (including an n-side electrode 75 and a p-side electrode 76) which contact with the semiconductor multilayer structure 20 and which inject carriers into the active layer 73.

This semiconductor multilayer structure 20 has a light extraction surface 50 which is made of a gallium nitride based semiconductor and on which an unevenness structure 60 has been formed on at least a part of a gallium nitride based semiconductor crystal plane other than a plane. In this specification, the "light extraction surface" refers herein to one of the surfaces of the gallium nitride based semiconductor light-emitting element in a stereoscopic shape, through which almost all light is extracted. If a nanostructure has been formed by patterning on the light extraction surface 50 as is done in this embodiment, that patterned surface actually has a huge number of microscopic surfaces that face various directions. That is to say, the light extraction surface 50 is a surface having such a structure that is formed by those numerous microscopic surfaces as viewed macroscopically. That is why strictly speaking, the light extraction surface 50 does not exactly correspond to the boundary between the gallium nitride based semiconductor and its external space. On the drawings, the light extraction surface 50 is illustrated as if the surface 50 were located inside of the boundary between the gallium nitride based semiconductor and the external space for the sake of clarity. The light extraction surface 50 is typically a plane but may also be curved either entirely or just partially as viewed macroscopically or may include locally some projections or depressions, of which the sizes are much larger than the wavelength of the light. In the example illustrated in FIG. 4A, the planar light extraction surface 50 is supposed to be defined entirely by a crystal plane other than a c plane. However, the light extraction plane 50 may include c planes locally. Such a light extraction plane 50 is parallel to the surface of the gallium nitride based semiconductor on which the unevenness structure 60 has not been formed yet.

The projections that form the unevenness structure 60 are arranged on the crystal plane (i.e., a crystal plane other than a c plane) and roughness curve elements on the surface of the unevenness structure 60 have an average length (RSm) of 150 nm to 800 nm. In this description, the "average length (RSm) of the roughness curve elements" refers herein to the average of lengths which are included in a roughness curve at a certain reference length and each of which has unevenness for one period. Supposing the unevenness structure has a period d, RSm=d is satisfied. Alternatively, the average length (RSm) of the roughness curve elements on the surface of the unevenness structure 60 may also be set to be 150 nm to 400 nm. Furthermore, the unevenness structure 60 may have an arithmetic mean roughness (Ra) of 10 nm to 800 nm. Optionally, this unevenness structure 60 may have projections having irregular shapes. Or the unevenness structure 60 may also have projections which are located at irregular positions on the crystal plane. It will be described later exactly what shape the unevenness structure 60 has and how to form such a structure 60.

In the examples illustrated in FIGS. 4A and 4B, the semiconductor multilayer structure 20 includes a substrate 71, and an n-type gallium nitride based semiconductor layer 72, a gallium nitride based semiconductor active layer 73, and a p-type gallium nitride based semiconductor layer 74, which have been stacked in this order on the substrate 71. The semiconductor multilayer structure 20 has been mounted on a circuit board 20 on which wiring 80 has been formed.

In the example illustrated in FIG. 4A, the n-side electrode 75 and the p-side electrode 76 are arranged on the same side of the semiconductor multilayer structure 20 and are connected to the wiring 80 on the circuit board 30 through bumps 90. According to the mounting technique shown in FIG. 4A, the substrate 71 is more distant from the circuit board 30 than the active layer 73. And this is a so-called "facedown mounting" technique. In this example, the light extraction surface 50 is located on the back surface of the substrate 71.

On the other hand, in the example illustrated in FIG. 4B, the n-side electrode 75 and the p-side electrode 76 are arranged on two different sides of the semiconductor multilayer structure 20. In the example illustrated in FIG. 4B, the n-side electrode 75 is arranged on the back surface of the substrate 71 and is connected to the wiring 80 on the circuit board 30 through bumps 90. The p-side electrode 76 is made of a transparent conductive material layer and covers the surface of the unevenness structure 60 over a wide range. The p-side electrode 76 is connected to the wiring 80 on the circuit board 30 using a bonding wire 85. According to the mounting technique shown in FIG. 4B, the active layer 73 is more distant from the circuit board 30 than the substrate 71. And this is a so-called "face-up mounting" technique. In this example, the light extraction surface 50 is located on the semiconductor layers that have grown on the substrate 71.

It should be noted that the substrate is not an indispensable one in any of these arrangements and can be removed either partially or entirely during the manufacturing process.

Hereinafter, an exemplary method for forming the unevenness structure 60 shown in FIGS. 4A and 4B will be described with reference to FIGS. 5A, 5B and 5C.

Figure 5A:
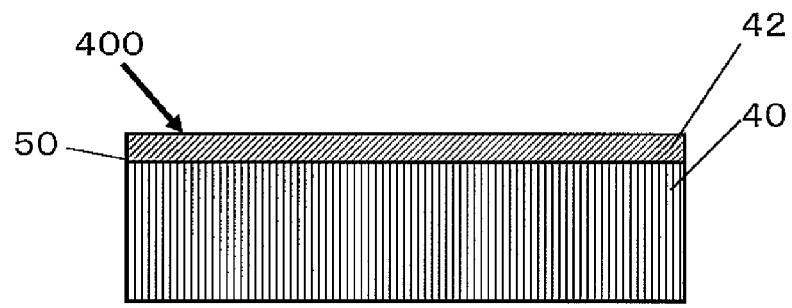
FIG. 5A is a cross-sectional view illustrating a status of a GaN based semiconductor light-emitting element having a crystal plane other than a c-plane according to a first exemplary embodiment of the present disclosure when the element has no light extraction surface yet.

First of all, a GaN based semiconductor 40 is provided as shown in FIG. 5A. This semiconductor 40 forms part of a semiconductor multilayer structure, of which the surface is a crystal plane 400 other than a c plane. In FIG. 5A, the semiconductor multilayer structure 20 shown in FIGS. 4A and 4B is not shown entirely, but only a portion of the semiconductor multilayer structure 20 in the vicinity of a surface on which the unevenness structure 60 will be formed is extracted and illustrated as the semiconductor 40. That is why this semiconductor 40 may sometimes form part of the substrate 71 shown in FIG. 4A and sometimes form part of the p-type gallium nitride based semiconductor layer 74 shown in FIG. 4B.

In FIG. 5A, a surface layer 42 is illustrated as being located on the light extraction surface 50. The surface layer 42 forms part of the semiconductor 40 that will be processed in a subsequent process step. Although the light extraction surface 50 shown in FIG. 5A is illustrated as being located between the surface layer 42 and the semiconductor 40, there is no definite boundary that separates the surface layer 42 from the semiconductor 40 but the surface layer 42 and the semiconductor 40 are actually physically continuous with each other.

According to this embodiment, the uppermost portion of the surface layer 42 is modified through oxidation reaction (i.e., subjected to surface modification) so as to have its wettability controlled. Specifically, the surface portion may be exposed to an oxygen plasma atmosphere to increase its hydrophilicity. The results of evaluation the present inventors carried out revealed that a gallium nitride based semiconductor is usually hydrophilic. However, by controlling its wettability so that its property becomes as close to "super-hydrophilicity" as possible, the effects of an embodiment of the present disclosure can be increased.

Figure 5B:
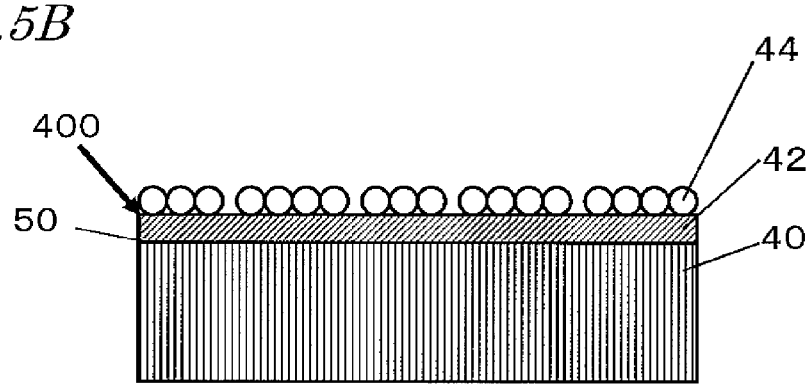
FIG. 5B is a cross-sectional view illustrating a status of the GaN based semiconductor light-emitting element having a crystal plane other than a c-plane according to the first exemplary embodiment of the present disclosure when its surface has been covered with a colloidal crystal layer.

Next, as shown in FIG. 5B, the crystal plane 400 of the GaN based semiconductor 40 is covered with a colloidal crystal layer 44. The "colloidal crystals" refer herein to a structure where particles having sizes on the order of sub-microns (i.e., in the range of $10^{-9}$ to $10^{-6}$ m), which will be referred to herein as "colloidal particles", are arranged periodically, and the "colloidal crystal layer" refers herein to a layer of such colloidal crystals. Those particles that form the colloidal crystal layer are arranged in a period that is approximately as long as the waveform of visible radiation. Such a periodic structure may be formed by some self-organizing process. However, by covering the surface of the semiconductor with such a colloidal crystal layer, the wettability on the surface of the semiconductor can be controlled sufficiently.

By performing this wettability controlling process step, the coverage of the colloidal crystal layer 44 can be increased. As a method for covering the surface layer 42 with the colloidal crystal layer 44, a process for self-organizing the colloidal crystal layer 44 on the surface layer 42 by dip-coating process using a colloidal solution may be adopted. Examples of major conditions to be controlled in this process step include the types of the solvent and solute of the colloidal solution, the concentration of the colloidal solution, and the pulling rate of the dip-coating process. The solvent may be a polar solvent having a large dissolution parameter, and may be water, methanol, ethanol, phenol, ethylene glycol, or acetic acid or may even be pure water. The solute may be a spherical hydrophilic solute having a small particle size distribution such as $SiO_2$, $TiO_2$, ZnO, Au, Ag, polystyrene, a benzoguanamine-melamine-formaldehyde condensate or cross-linked polymethylmethacrylate or a combination thereof. The particle size may be 50 nm to 700 nm and is suitably in the range of 100 nm to 500 nm, for example. The colloidal solution may have a concentration of 10 vol % or less, for example. The dip coating process may be performed at a pulling rate of 10 cm/h or less, for example. By dipping the semiconductor 40, of which the surface layer 42 has been subjected to the wettability control, in the colloidal solution and then pulling up the semiconductor 40 at a rate falling within the range defined above, the surface layer 42 can be covered with the colloidal crystal layer 44.

Next, using this colloidal crystal layer 44 as a mask, the crystal plane 400 of the GaN based semiconductor 40 is etched. In this process step, as not only the crystal plane 400 of the GaN based semiconductor 40 but also the colloidal crystal layer 44 itself are etched as well, the crystal plane 400 of the GaN based semiconductor 40 comes to have an unevenness corresponding to the arrangement pattern of the particles that form the colloidal crystal layer 44. In this manner, the semiconductor 40 comes to have an unevenness structure 60 as shown in FIG. 5C. The etching process carried out in this process step may be a dry etching process using chlorine gas, for example. By adjusting the etching process time and condition, the size and shape of projections that form the unevenness structure 62 can be controlled. Even though a boundary is drawn between the unevenness structure 60 and the semiconductor 40 in FIG. 5C, actually there is no definite boundary between them.

As described above, the colloidal crystal layer is comprised of particles that are arranged periodically. However, the unevenness structure that has been formed on the surface of the semiconductor by etching the semiconductor surface covered with the colloidal crystal layer now has a great many projections having irregular shapes. This is probably because the colloidal crystal layer is comprised of too many particles and has openings in too complex shapes to advance the etching process on the semiconductor surface uniformly. If the shape, size, material and particle size distribution of the particles that form the colloidal crystal layer and the etching process condition are adjusted, various unevenness structures can be formed.

Also, since portions of the crystal plane that were hidden behind those particles either have not been etched at all or have hardly been etched to be left as those projections, the projections that form the unevenness structure will be arranged on the crystal plane.

According to an embodiment of the present disclosure, the colloidal crystal layer can be formed relatively easily even when particles, of which the diameter is approximately as small as the wavelength of visible radiation, are used. For that reason, an unevenness structure having an even smaller size than a mask pattern to be formed by normal photolithographic process can be obtained. In addition, the unevenness structure of this embodiment of the present disclosure has projections having irregular shapes at random, which is another difference from an unevenness structure formed by normal photolithographic process. It should be noted that the surface of the semiconductor, on which such an unevenness structure according to an embodiment of the present disclosure has been formed, could be called a "textured surface". In an embodiment of the present disclosure, the density of the projections included in the unevenness structure may fall within the range of 1 projection per $\mu m^2$ through 50 projections per $\mu m^2$.

Hereinafter, a nitride semiconductor light-emitting element 77 according to this embodiment will be described with reference to FIG. 6.

Figure 6:
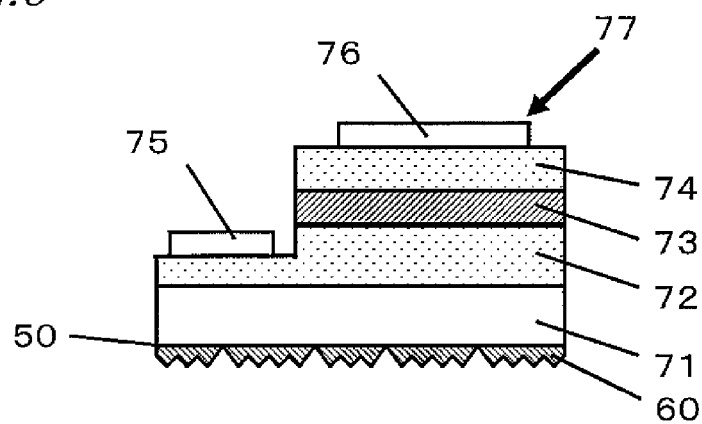
FIG. 6 is a view illustrating the structure of a nitride semiconductor light-emitting element having a crystal plane other than a c plane.

The nitride semiconductor light-emitting element 77 shown in FIG. 6 includes a GaN substrate 71 of which the principal surface and back surface are crystal planes other than a c plane, an n-type nitride semiconductor layer 72 which has been formed on the crystal plane of the GaN substrate 71, a nitride semiconductor active layer 73, a p-type nitride semiconductor layer 74, a p-side electrode 76 which contacts with the p-type nitride semiconductor layer 74, and an n-side electrode 75 which contacts with the n-type nitride semiconductor layer 72.

The light extraction surface 50 is located on the back surface of the GaN substrate 71 having a crystal plane other than a c plane, i.e., opposite from the surface on which the n-type nitride semiconductor layer 72 is formed. According to this embodiment, the unevenness structure 60 is formed on this light extraction surface 50.

The crystal plane other than a c plane may be a crystal plane on the surface of the GaN based semiconductor which defines a tilt angle of 18 to 90 degrees with respect to the c axis of GaN. This embodiment is effectively applicable to such a crystal plane which defines a tilt angle of 18 to 90 degrees with respect to the c axis of GaN due to the atomic structure on the surface of the GaN based semiconductor substrate. The angle defined by the atomic bonds on the $sp^3$-orbital is 108 degrees. That is why a GaN crystal plane which defines a tilt angle of at least 18 degrees (obtained by subtracting 90 degrees from 108 degrees) with respect to the c axis has two or more atomic bonds on the surface of the crystal, and therefore, can be said to have a different atomic structure from c-plane GaN. That is why this embodiment should be effectively applicable to a crystal plane which defines a tilt angle of at least 18 degrees with respect to the c axis of GaN. The respective surfaces of m-plane GaN and a-plane GaN define a tilt angle of 90 degrees with respect to the c-axis of GaN, and fall within this range. Likewise, the respective surfaces of −r-plane GaN and +r-plane GaN define a tilt angle of approximately 43 degrees with respect to the c-axis of GaN, and fall within this range, too.

In this embodiment, the substrate 71 may have such a plane orientation that causes the light emitted from the nitride semiconductor active layer 73 to have a polarization property. For example, the substrate 71 may be an m-plane GaN substrate, a substrate of which the surface is a non-polar plane such as an a plane, or a substrate of which the surface is a semi-polar plane such as an r plane or one of {11-22} family of planes.

If the surface of the substrate 71 is selected in this manner, the light emitted from the nitride semiconductor active layer 73 will have polarization property. For example, the nitride semiconductor active layer 73 that has been formed on an m plane will emit light, of which the electric field intensity is mostly biased toward a direction that is parallel to the a axis. The nitride semiconductor active layer 73 that has been formed on an a plane will emit light, of which the electric field intensity is mostly biased toward a direction that is parallel to the m axis.

Furthermore, the nitride semiconductor active layer 73 that has been formed on one of {11-20} family of planes, which is a semi-polar plane, will emit light, of which the electric field intensity is mostly biased toward a direction that is parallel to the m axis, if the nitride semiconductor active layer 73 has a small In composition. On the other hand, if the nitride semiconductor active layer 73 has a large In composition, the nitride semiconductor active layer 73 will emit light, of which the electric field intensity is mostly biased toward a [−1-123] direction. The polarization property of the nitride semiconductor active layer 73 on such a semi-polar plane is determined by the behaviors of two upper bands (which are usually called an "A band" and a "B band", respectively) of the valence band. In some cases, however, the polarization property may also be affected by the magnitude of strain applied to the nitride semiconductor active layer 73 or the quantum confinement effect.

In this description, the "m plane" includes not only a plane which is perfectly parallel to an m plane but also a plane which defines a tilt angle of within ±5 degrees with respect to the m plane. If the plane is just slightly tilted with respect to the m plane, the influence of spontaneous electrical polarization is very limited. According to crystal growing technologies, sometimes a semiconductor layer can be epitaxially grown more easily on a substrate, of which the surface defines a very small tilt angle with respect to a crystallographic orientation, rather than on a substrate, of which the surface is exactly defined by the crystallographic orientation. That is why it could be useful to get the crystal plane tilted intentionally in order to improve the quality of the semiconductor layer to be grown epitaxially or increase the crystal growing rate with the influence of the spontaneous electrical polarization reduced sufficiently. The same statement applies to non-polar planes other than the m plane and to anti-polar planes, too.

The n-type nitride semiconductor layer 72 may be made of n-type $Al_uGa_vIn_wN$ (where u+v+w=1, u≥0, v≥0 and w≥0), for example. As the n-type dopant, silicon (Si) may be used, for example.

The p-type nitride semiconductor layer 74 may be made of p-type $Al_sGa_tN$ (where s+t=1, s≥0 and t≥0), for example. As the p-type dopant, Mg may be added, for example. Alternatively, Zn or Be may be added as a p-type dopant instead of Mg. In the p-type nitride semiconductor layer 74, the composition s of Al may be uniform, or may vary either continuously or stepwise, in the thickness direction. Specifically, the p-type nitride semiconductor layer 74 may have a thickness of approximately 0.05 to 2 μm, for example.

A portion of the p-type nitride semiconductor layer in the vicinity of its upper surface (i.e., near the boundary with the p-side electrode 76) may be made of a semiconductor with a zero Al composition s, i.e., may be made of GaN. In that case, GaN may be heavily doped with a p-type dopant and that portion may function as a contact layer.

The nitride semiconductor active layer 73 may have a GaInN/GaInN multiple quantum well (MQW) structure in which, for example; $Ga_{1-x}In_xN$ well layers having a thickness of approximately 3 to 20 nm and $Ga_{1-y}In_yN$ barrier layers having a thickness of approximately 5 to 30 nm (where 0≤y<x<1) are stacked alternately one upon the other.

The wavelength of the light emitted from the nitride semiconductor light-emitting element 77 is determined by the In composition x in $Ga_{1-x}In_xN$ which is the semiconductor composition of the well layers. In the nitride semiconductor active layer 73 which has been formed on an m plane, for example, no piezoelectric field is generated. That is why even if the In composition is increased, a decrease in luminous efficiency can still be prevented.

The n-side electrode 75 may be a stack of Ti and Pt layers (Ti/Pt), for example. In one embodiment, the p-side electrode 76 covers almost the entire surface of the p-type nitride semiconductor layer 74. The p-side electrode 76 may be a stack of Pd and Pt layers (Pd/Pt), for example.

Figure 7:
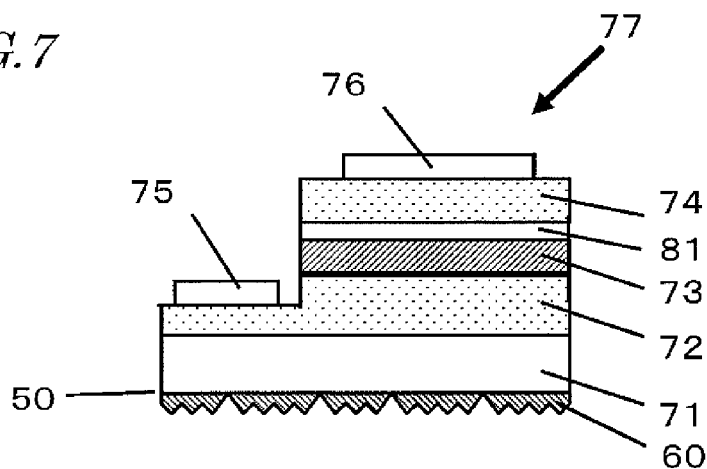
FIG. 7 is a view illustrating the structure of a modified example of the nitride semiconductor light-emitting element having a crystal plane other than a c plane.

Optionally, in this embodiment, an undoped GaN layer 81 may be formed between the nitride semiconductor active layer 73 and the p-type nitride semiconductor layer 74 (see FIG. 7).

Figure 8:
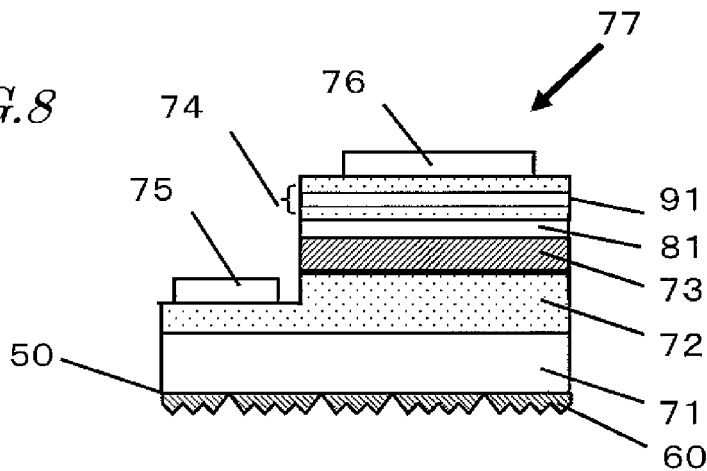
FIG. 8 is a view illustrating the structure of another modified example of the nitride semiconductor light-emitting element having a crystal plane other than a c plane.

Also, a p-AlGaN layer 91 may be formed in the p-type nitride semiconductor layer 74 (see FIG. 8). By providing the p-AlGaN layer 91, the overflow of electrons can be reduced significantly during the operation.

The light extraction surface 50 is located on the back surface of the substrate 71, i.e., opposite from the surface on which the n-type nitride semiconductor layer 72 is arranged. And an unevenness structure 60 has been formed on this light extraction surface 50. By adopting this configuration, not just can the light extraction efficiency be increased but also can the degree of polarization be reduced and the luminous intensity distribution be improved as well.

Hereinafter, it will be described with reference to FIG. 6 once again how to fabricate the nitride semiconductor light-emitting element 77 according to this embodiment.

First of all, an n-type nitride semiconductor layer 72 is grown epitaxially by MOCVD method, for example, on the principal surface of the n-type GaN substrate 71, which is a crystal plane other than a c plane. Using Si as an n-type dopant and supplying $TMG(Ga(CH_3)_3)$ and $NH_3$ gases as source gases, an n-type nitride semiconductor layer 72 of GaN is deposited to a thickness of approximately 1 to 3 μm at a growing process temperature of approximately 900 to 1100 degrees Celsius, for example.

Next, a nitride semiconductor active layer 73 is formed on the n-type nitride semiconductor layer 72. The nitride semiconductor active layer 73 has a GaInN/GaN multiple quantum well (MQW) structure in which $Ga_{1-x}In_xN$ well layers having a thickness of 15 nm and GaN barrier layers having a thickness of 30 nm are stacked alternately one upon the other. In forming the $Ga_{1-x}In_xN$ well layers, the growing process temperature may be decreased to 800 degrees Celsius in order to introduce In. The emission wavelength is selected according to the intended application of the nitride semiconductor light-emitting element 77 and the In composition x is determined according to the wavelength. Specifically, if the wavelength is set to be 450 nm (falling within the color blue wavelength range), the In composition x is set to fall within the range of 0.18 to 0.2. If the wavelength is set to be 520 nm (falling within the color green wavelength range), x=0.29 to 0.31. And if the wavelength is set to be 630 nm (falling within the color red wavelength range), x=0.43 to 0.44.

If an undoped GaN layer 81 needs to be deposited to a thickness of 15 nm to 50 nm, for example, on the nitride semiconductor active layer 73 as shown in FIG. 7, a p-type nitride semiconductor layer 74 is formed on the undoped GaN layer 81. To form the p-type nitride semiconductor layer 74, $Cp_2Mg$ (cyclopentadienyl magnesium) may be used as a p-type dopant and TMG and $NH_3$ may be supplied as source gases, for example. In this manner, a p-type nitride semiconductor layer of p-type GaN can be deposited to a thickness of approximately 50 to 300 nm at a growing process temperature of approximately 900 to 1100 degrees Celsius.

Optionally, if a p-AlGaN layer 91 having a thickness of approximately 15 to 30 nm is formed inside the p-type nitride semiconductor layer 74 as shown in FIG. 8, the overflow of electrons can be suppressed during the operation.

Now take a look at FIG. 6 again. After the p-type nitride semiconductor layer 74 has been formed, a heat treatment is conducted at a temperature of approximately 800 to 900 degrees Celsius for about 20 minutes.

Next, a dry etching process is performed using a chlorine based gas to form a recess by removing selectively the p-type nitride semiconductor layer 74, the nitride semiconductor active layer 73 and the n-type nitride semiconductor layer 72 and expose the n-type nitride semiconductor layer 72 partially.

Subsequently, an n-side electrode 75 is formed so as to contact with a portion of the n-type nitride semiconductor layer 72 exposed. A stack of Ti/Pt layers may be formed as the n-side electrode 75, for example. Meanwhile, a p-side electrode 76 is formed so as to contact with the p-type nitride semiconductor layer 74. A stack of Pd/Pt layers may be formed as the p-side electrode 76, for example. Thereafter, the Ti/Pt layers of the n-side electrode 75 and the n-type nitride semiconductor layer 72 are alloyed together, so are the Pd/Pt layers of the p-side electrode 76 and the p-type nitride semiconductor layer 74, by conducting a heat treatment.

After that, the n-type GaN substrate 71 is polished and has its thickness reduced to approximately 50 to 300 μm. By reducing the thickness of the substrate 71 in this manner, not just can the substrate 71 be diced easily but also can absorption of light inside the nitride semiconductor light-emitting element 77 be reduced as well.

Figure 5C:
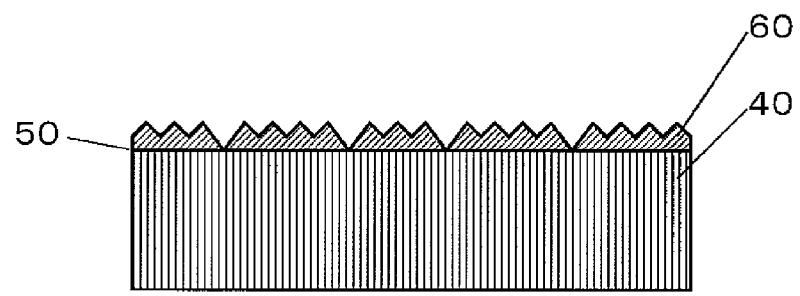
FIG. 5C is a cross-sectional view illustrating a status of the GaN based semiconductor light-emitting element having a crystal plane other than a c-plane according to the first exemplary embodiment of the present disclosure when the colloidal crystal layer has turned into a pattern structure.

On the light extraction surface 50 of the nitride semiconductor light-emitting element 77 which has gone through the polishing process step, an unevenness structure 60 such as the one shown in FIG. 5C is formed by the method described above.

Next, the material that has covered the electrodes of the nitride semiconductor light-emitting element 77 is removed. For example, if a lift-off photoresist is used to cover the electrodes, the photoresist can be removed easily with a resist remover liquid. Thereafter, organic cleaning is carried out to obtain a clean nitride semiconductor light-emitting element 77 having the unevenness structure 60.

The nitride semiconductor light-emitting element 77 thus fabricated is diced into respective chips, each of which will be mounted and bonded onto a circuit board made of alumina, AlN or a resin. If the circuit board is made of Si or Ge, its surface is suitably coated with an insulating film. The wiring may be arranged to match the shapes of the electrodes of the nitride semiconductor light-emitting element 77. The wiring may be made of Cu, Au, Ag or Al, for example. Any of these materials may be deposited on the circuit board by either sputtering or plating.

Figure 9:
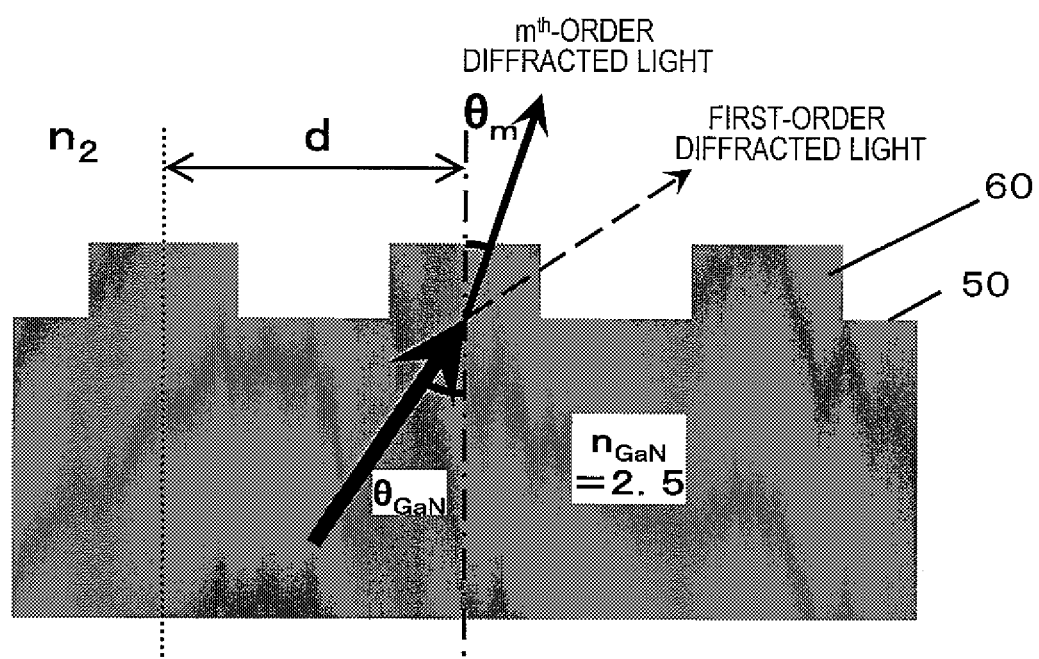
FIG. 9 schematically illustrates how an $m^{th}$-order diffracted light ray is produced by the unevenness structure.
Figure 10A:
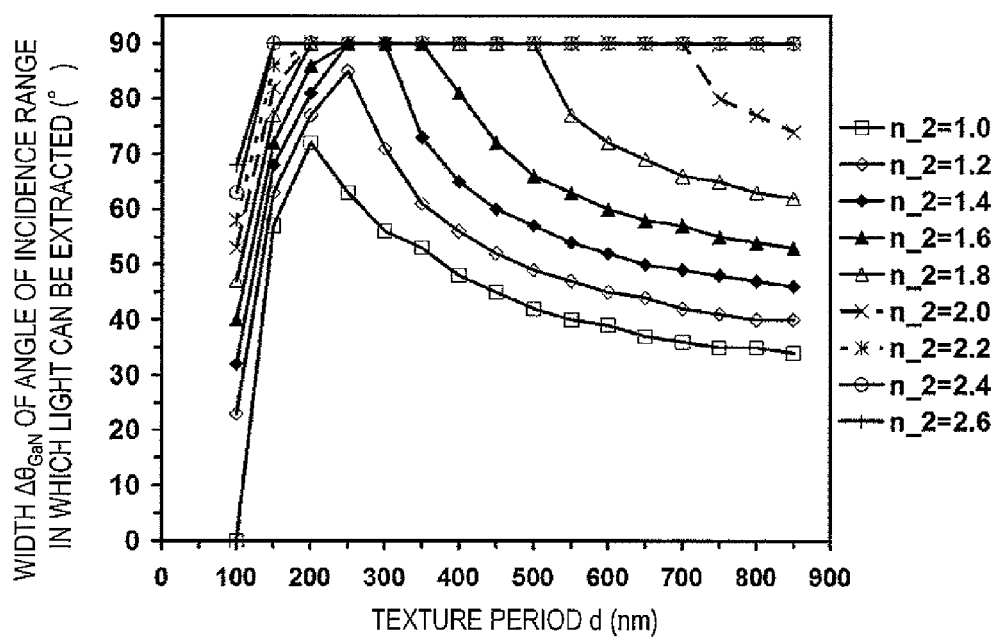
FIG. 10A is a graph showing relations between the width $\Delta\theta_{GaN}$ of an angle of incidence range in which light could be extracted, the texture period d and the refractive index $n_2$ of the external space when the incident light had a wavelength λ of 350 nm.
Figure 10B:
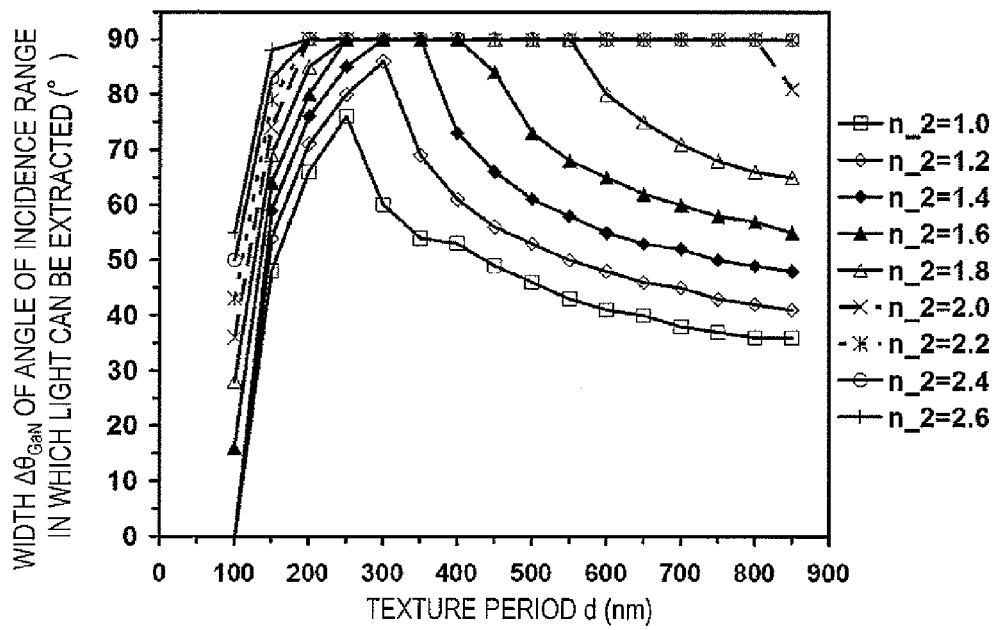
FIG. 10B is a graph showing relations between the width $\Delta\theta_{GaN}$ of an angle of incidence range in which light could be extracted, the texture period d and the refractive index $n_2$ of the external space when the incident light had a wavelength λ of 400 nm.
Figure 10C:
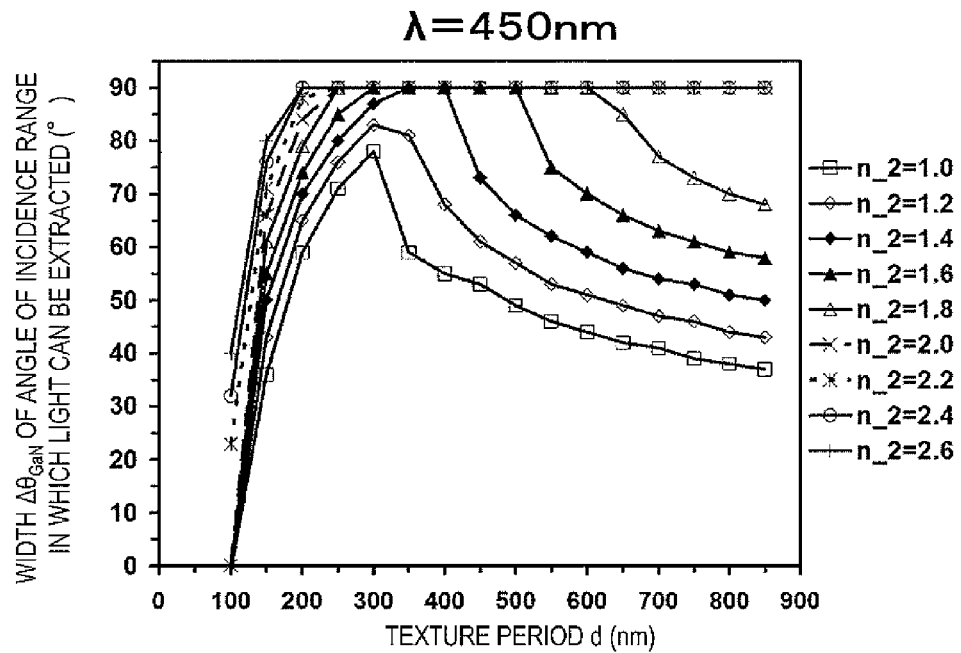
FIG. 10C is a graph showing relations between the width $\Delta\theta_{GaN}$ of an angle of incidence range in which light could be extracted, the texture period d and the refractive index $n_2$ of the external space when the incident light had a wavelength λ of 450 nm.
Figure 10D:
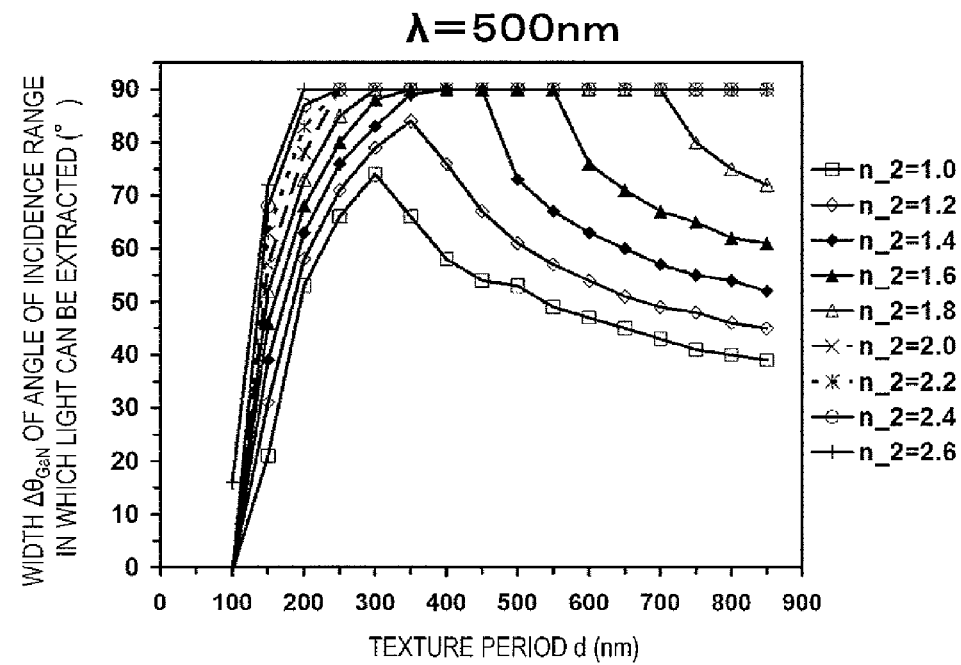
FIG. 10D is a graph showing relations between the width $\Delta\theta_{GaN}$ of an angle of incidence range in which light could be extracted, the texture period d and the refractive index $n_2$ of the external space when the incident light had a wavelength λ of 500 nm.
Figure 10E:
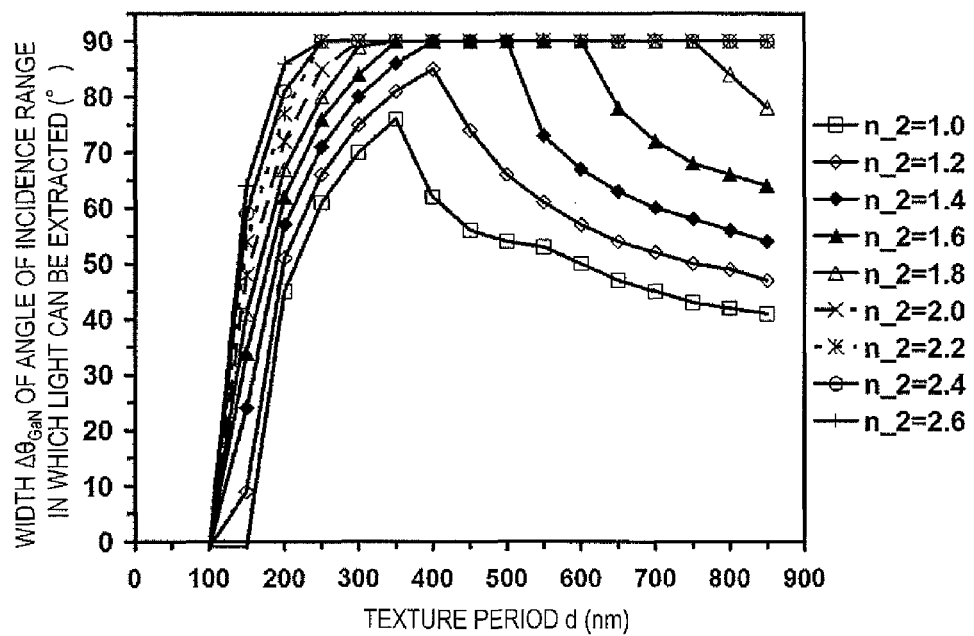
FIG. 10E is a graph showing relations between the width $\Delta\theta_{GaN}$ of an angle of incidence range in which light could be extracted, the texture period d and the refractive index $n_2$ of the external space when the incident light had a wavelength λ of 550 nm.
Figure 10F:
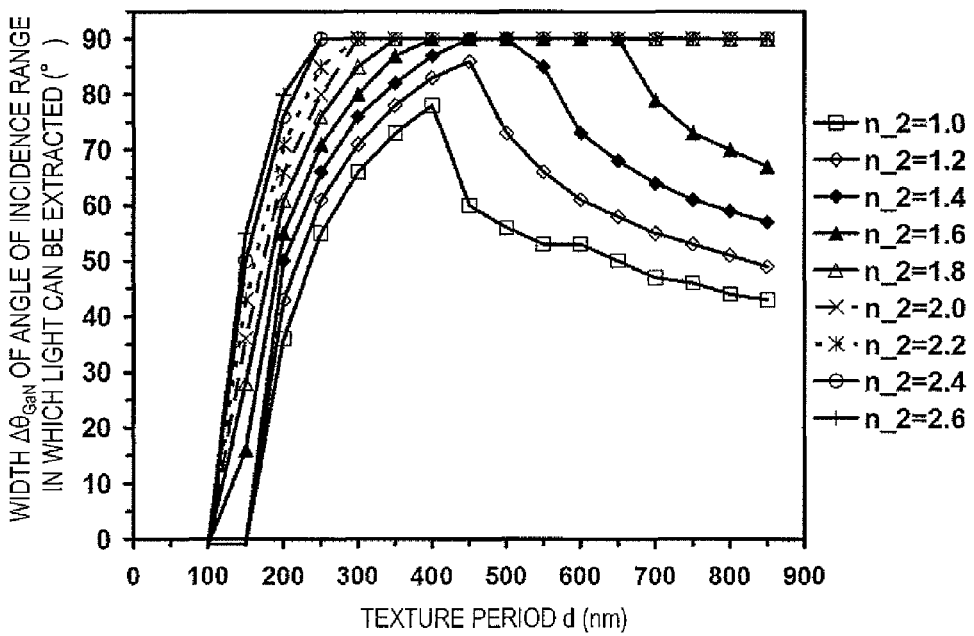
FIG. 10F is a graph showing relations between the width $\Delta\theta_{GaN}$ of an angle of incidence range in which light could be extracted, the texture period d and the refractive index $n_2$ of the external space when the incident light had a wavelength λ of 600 nm.
Figure 10G:
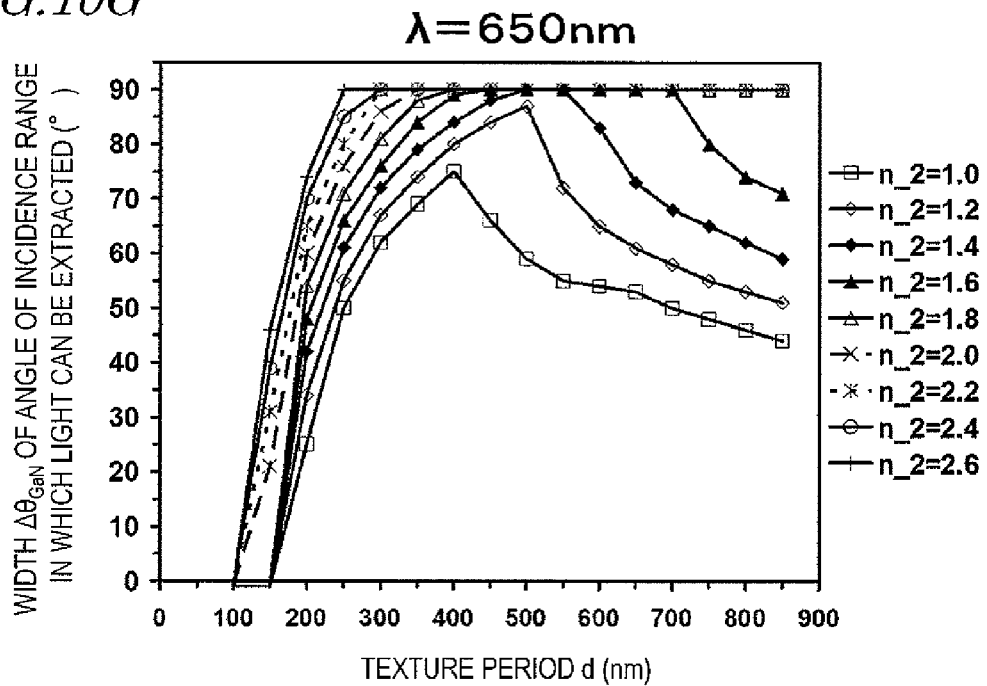
FIG. 10G is a graph showing relations between the width $\Delta\theta_{GaN}$ of an angle of incidence range in which light could be extracted, the texture period d and the refractive index $n_2$ of the external space when the incident light had a wavelength λ of 650 nm.
Figure 10H:
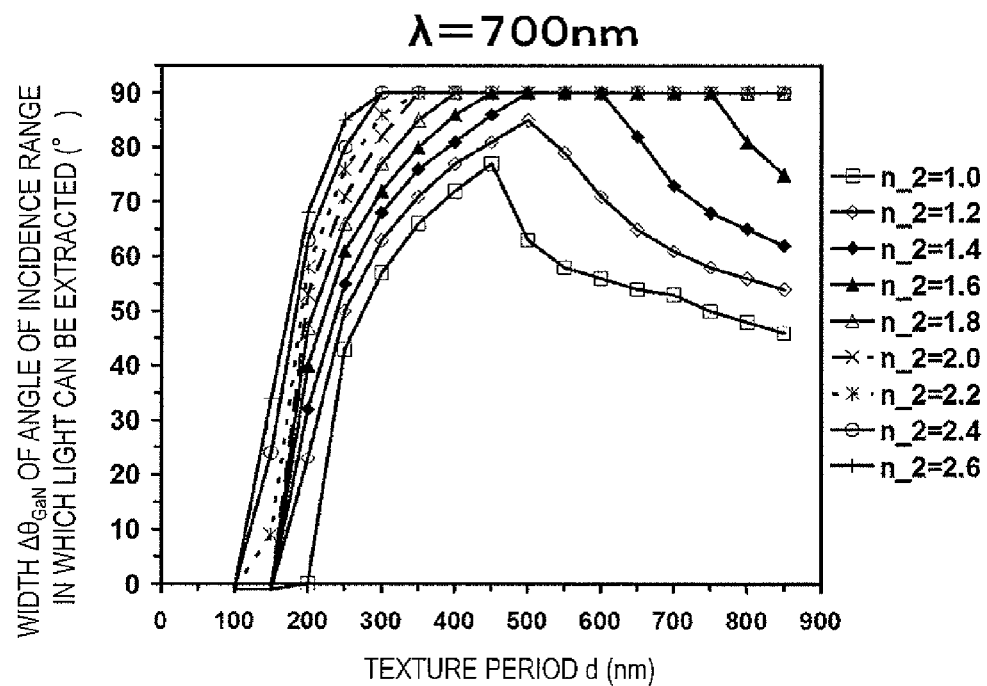
FIG. 10H is a graph showing relations between the width $\Delta\theta_{GaN}$ of an angle of incidence range in which light could be extracted, the texture period d and the refractive index $n_2$ of the external space when the incident light had a wavelength λ of 700 nm.
Figure 10I:
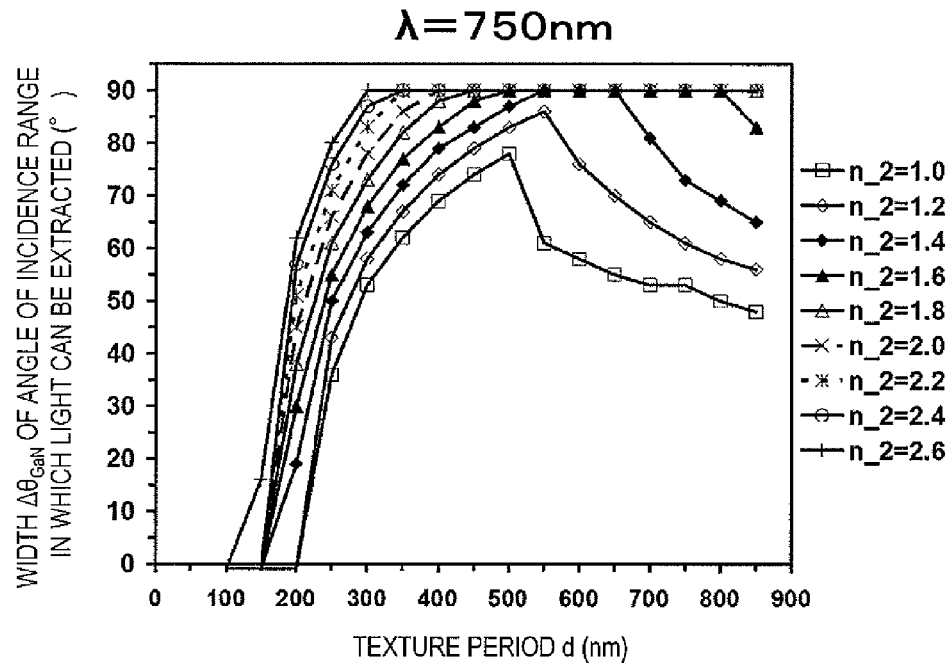
FIG. 10I is a graph showing relations between the width $\Delta\theta_{GaN}$ of an angle of incidence range in which light could be extracted, the texture period d and the refractive index $n_2$ of the external space when the incident light had a wavelength λ of 750 nm.
Figure 10J:
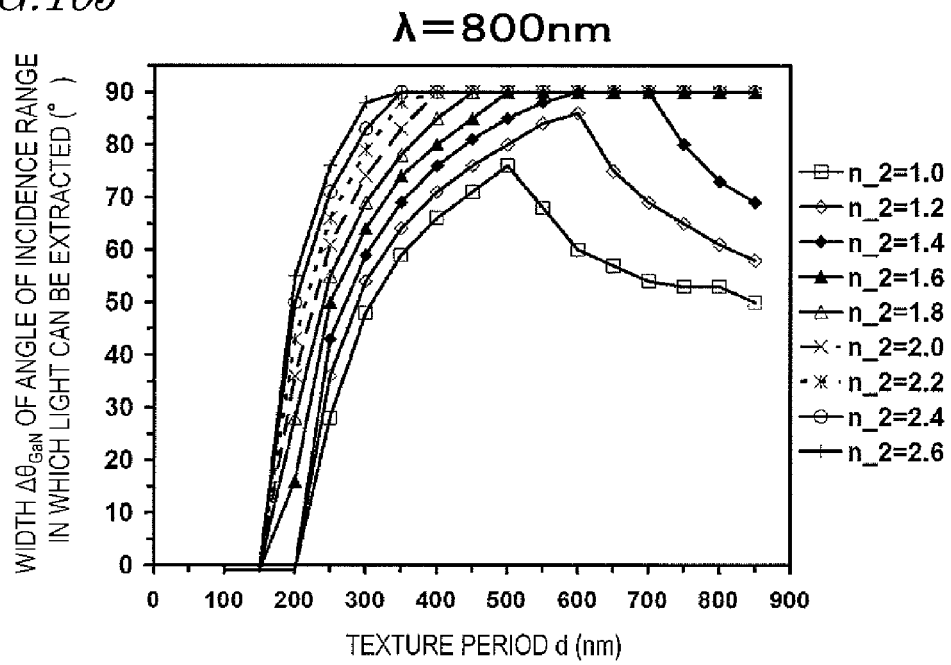
FIG. 10J is a graph showing relations between the width $\Delta\theta_{GaN}$ of an angle of incidence range in which light could be extracted, the texture period d and the refractive index $n_2$ of the external space when the incident light had a wavelength λ of 800 nm.

Next, it will be described with reference to FIG. 9 how this unevenness structure 60 works. FIG. 9 is a cross-sectional view illustrating schematically an $m^{th}$-order diffracted light ray to be produced by the unevenness structure 60. In FIG. 9, illustrated is only a portion of the nitride semiconductor light-emitting element 77 that has the unevenness structure 60.

If that portion of the nitride semiconductor light-emitting element 77 that functions as the light extraction surface 50 is made of gallium nitride (GaN), then its refractive index $n_{GaN}$ is 2.5. Suppose the nitride semiconductor light-emitting element 77 has no unevenness structure 60 and its uppermost layer is the flat surface of the light extraction surface 50. In that case, if light is emitted from the nitride semiconductor light-emitting element 77 into the external air that has a refractive index of one and if the angle of incidence $\theta_{GaN}$ is 23.6 degrees, then the angle of emittance $\theta_1$ of the first-order diffracted light ray will be 90 degrees. That is to say, if the angle of incidence $\theta_{GaN}$ is equal to or greater than 23.6 degrees, the incident light will be totally reflected, and therefore, the light cannot be extracted to the external space. That is to say, if the light extraction surface 50 is flat, then the range of the angle of incidence $\Delta\theta_{GaN}$ in which the light can be extracted will be 0 through 23.6 degrees (i.e., $\Delta\theta_{GaN}$=23.6 degrees).

Next, suppose a situation where the unevenness structure 60 has been formed on the light extraction surface 50 in a period that is defined by an arbitrary length d as shown in FIG. 9. If this period d is smaller than 1 μm, then incident light falling within the visible radiation wavelength range (more specifically, incident light having a wavelength of 350 nm to 800 nm which has been produced by the nitride semiconductor active layer 73 of the nitride semiconductor light-emitting element 77) and the unevenness structure 60 will interact with each other to produce minus-first-order diffraction. When such minus-first-order diffraction is produced, the refractive index $n_{GaN}$ of the nitride semiconductor light-emitting element 77, the refractive index $n_2$ of the external space, the angle of incidence $\theta_{GaN}$, the angle of emittance $\theta_{-1}$, the wavelength λ of the incident light, and the period d of the unevenness structure satisfy the following Equation (1):

$$n_2 \sin\theta_m - n_{GaN}\sin\theta_{GaN} = -\frac{\lambda}{d} \qquad (1)$$

The refractive index $n_{GaN}$ is 2.5, the refractive index $n_2$ of the external space is 1.0 to 2.6, the angle of incidence $\theta_{GaN}$ is 0 to 90 degrees, the wavelength λ of the incident light is 350 nm to 800 nm, and the texture period d is 100 nm to 850 nm. In this description, the "texture period d" refers herein to the average interval between adjacent projections in the unevenness structure 60. The range of the angle of emittance $\theta_n$ that could be produced under this condition was calculated, and the range of values that the angle of incidence $\theta_{GaN}$, associated with an angle of emittance $\theta_n$ having a finite value (i.e., having a solution within the range of −90 through 90 degrees), could have (i.e., the width $\Delta\theta_{GaN}$ of the range of the angles of incidence in which light could be extracted) was obtained. The results are shown in FIGS. 10A through 10J, of which the wavelengths λ increase at a step of 50 nm from 350 nm to 800 nm. As described above, the average length (RSm) of the roughness curve elements is the average of lengths which are included in a roughness curve at a certain reference length and each of which has unevenness for one period, and therefore, is equal to the period d of the unevenness structure.

As can be seen from these results, if the texture period d of the unevenness structure 60 or the size of its projections were too small or too large compared to the wavelength of the light, the width $\Delta\theta_{GaN}$ of the range of the angles of incidence in which light can be extracted would be narrower. If the period d of the unevenness structure is set to fall within the range of 150 nm to 800 nm with respect to incident light having a wavelength of 350 nm to 800 nm, the light extraction efficiency can be increased. And by setting the period d of the unevenness structure to fall within the range of 150 nm to 400 nm, the light extraction efficiency can be further increased.

Figure 11:
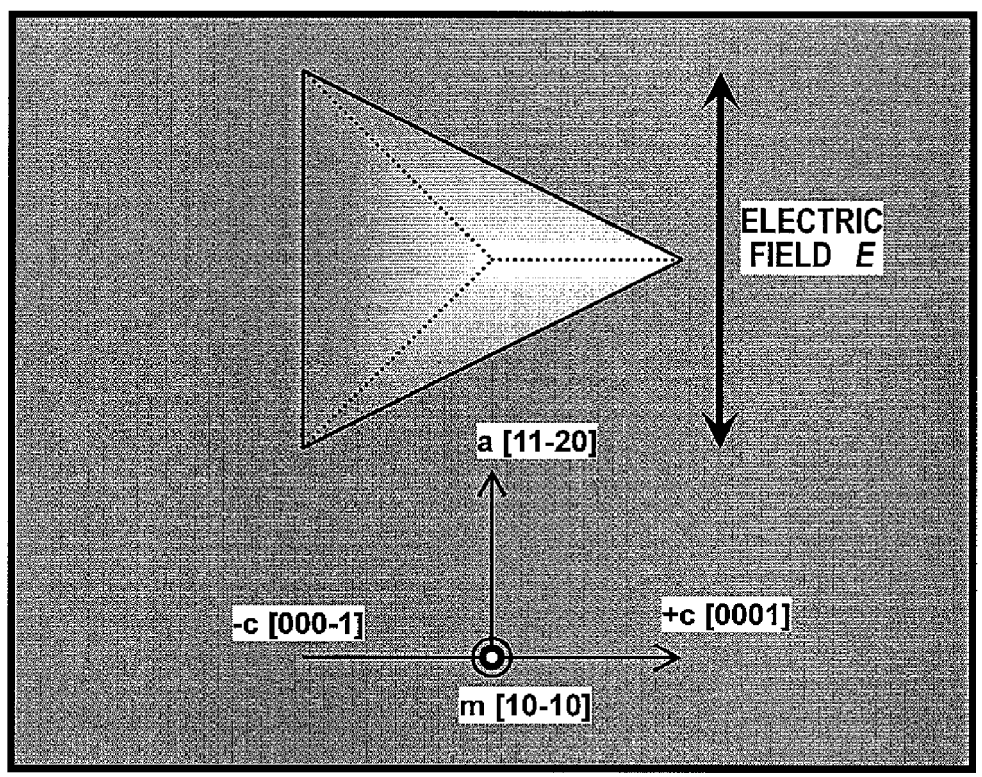
FIG. 11 shows a relation between the electric field direction and an unevenness structure in a nitride semiconductor active layer, of which the principal surface is an m plane.

Optionally, the shape of the unevenness structure or that of the projections that form the unevenness structure does not have to be axisymmetric with respect to a normal line to the light extraction surface 50. The reason is that as the nitride semiconductor active layer 73 that has been formed on an m plane will emit (polarized) light, of which the electric field intensity is mostly biased toward a direction that is parallel to the a axis as described above, if the projections or depressions of the unevenness structure 60 that has been formed on an m plane has surfaces that do not intersect at right angles with, or are not parallel to, the a axis, the degree of polarization can be reduced effectively. That is to say, the projections have a surface that defines an angle of more than 0 degrees but less than 90 degrees with respect to the polarization direction. For that purpose, the unevenness structure may have such an asymmetric shape. If the projections or depressions of the unevenness structure 60 have either the triangular pyramid shape as shown in FIG. 11 or a generally triangular pyramid shape, their surface never intersects with the a axis at right angles and is never parallel to the a axis, either.

Embodiment 2

Figure 13:
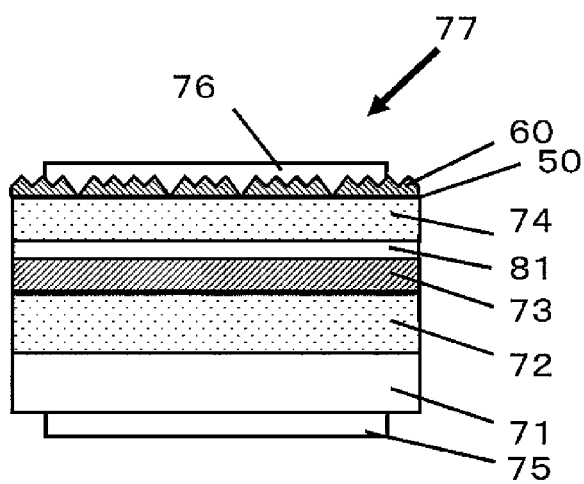
FIG. 13 is a view illustrating the structure of a modified example of the nitride semiconductor light-emitting element having a crystal plane other than a c plane according to the second exemplary embodiment.
Figure 14:
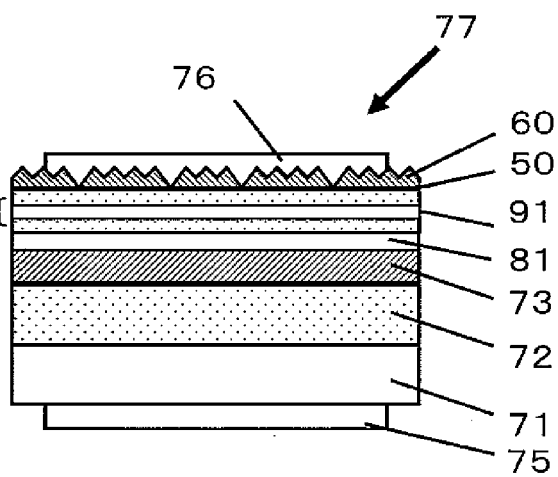
FIG. 14 is a view illustrating the structure of another modified example of the nitride semiconductor light-emitting element having a crystal plane other than a c plane according to the second exemplary embodiment.

Hereinafter, a second embodiment of the present disclosure will be described with reference to FIGS. 12, 13 and 14.

Figure 12:
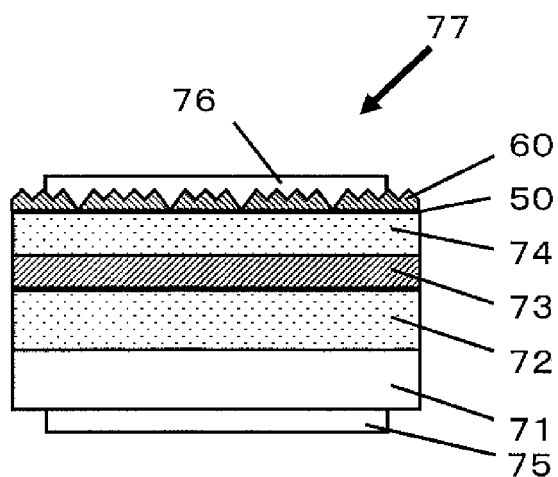
FIG. 12 is a view illustrating the structure of a nitride semiconductor light-emitting element having a crystal plane other than a c plane according to a second exemplary embodiment of the present disclosure.

FIG. 12 illustrates the structure of a nitride semiconductor light-emitting element as a second embodiment of the present disclosure. FIGS. 13 and 14 illustrate two modified examples of the nitride semiconductor light-emitting element according to the second embodiment.

In this second embodiment, the substrate 71 may be an m-plane GaN substrate or an m-plane GaN layer on a substrate of a different material such as an m-plane SiC substrate or an r-plane sapphire substrate. The principal surface of the substrate 71 does not have to be an m plane but may also have any other crystallographic plane orientation that causes the light emitted from the nitride semiconductor active layer 73 to have polarization property. For example, a substrate, of which the principal surface is a non-polar plane such as an a plane or a semi-polar plane such as an r plane or one of {11-22} family of planes, may also be used as the substrate 71.

In this second embodiment, the light extraction surface 50 is located between the p-type nitride semiconductor layer 74 and the p-side electrode 76, and a transparent electrode is used as the p-side electrode 76. It should be noted that the light extraction surface 50 is illustrated just for the sake of convenience to make this embodiment easily understandable. And the unevenness structure 60 is formed between this light extraction surface 50 and the p-side electrode 76.

According to the second embodiment, fabricated is a nitride semiconductor light-emitting element 77 having a crystal plane other than a c plane. Specifically, first of all, an n-type nitride semiconductor layer 72, a nitride semiconductor active layer 73 and a p-type nitride semiconductor layer 74 are epitaxially grown by MOCVD method on a substrate 71 including a GaN layer, of which the surface is a crystal plane other than a c plane, for example. Thereafter, a heat treatment is conducted at a temperature of approximately 800 to 900 degrees Celsius for about 20 minutes. Optionally, as in the first embodiment described above, an undoped GaN layer 81 (see FIG. 13) may be deposited on the nitride semiconductor active layer 73. In that case, the p-type nitride semiconductor layer 74 is formed on the undoped GaN layer 81. Also, a p-AlGaN layer 91 (see FIG. 14) may be formed in the p-type nitride semiconductor layer 74. The same process steps as those of the first embodiment are performed up to this point.

Next, the n-type GaN substrate 71 is polished to have its thickness reduced as in the first embodiment. And on the light extraction surface 50 of the nitride semiconductor light-emitting element 77 that has gone through this polishing process step, an unevenness structure 60 as shown in FIG. 5C is formed.

First, as in the first embodiment described above, a surface not to be covered with the colloidal crystal layer 44, i.e., the polished surface of the n-type GaN substrate 71 in this second embodiment, is covered with a lift-off photoresist which is soluble in an organic solvent, a kind of sheet such as a paraffin sheet, a tape, or any other coating member.

Next, as in the first embodiment described above, the surface layer 42 (see FIG. 5A) which is not covered with the photoresist or any other coating member but in contact with the external space has its wettability controlled and is covered with a colloidal crystal layer 44 such as the one shown in FIG. 5B. As a method for covering the surface layer 42 with the colloidal crystal layer 44, a process for self-organizing the colloidal crystal layer 44 on the surface layer 42 by dip-coating process using a colloidal solution may be adopted as in the first embodiment. The surface layer 42 that has gotten covered with the colloidal crystal layer 44 in this manner is dry-etched to form the unevenness structure 60. Next, the n-type GaN substrate 71 has its coating member removed and subjected to organic cleaning.

Subsequently, an n-side electrode 75 is formed so as to contact with the polished surface of the n-type GaN substrate 71 exposed. A stack of Ti/Pt layers may be formed as the n-side electrode 75, for example. Meanwhile, a p-side electrode 76 is formed so as to contact with the unevenness structure 60 that has been formed on the p-type nitride semiconductor layer 74. An ITO layer may be formed as the p-side electrode 76, for example. Thereafter, the Ti/Pt layers of the n-side electrode 75 and the n-type GaN substrate 71 are alloyed together, so are the ITO layer of the p-side electrode 76 and the unevenness structure 60, by conducting a heat treatment. The nitride semiconductor light-emitting element 77 thus fabricated is diced into respective chips, each of which will be mounted and bonded onto a circuit board.

Example 1

As Example 1, three m-plane GaN substrates were provided and all of them had their upper and lower sides both mirror-polished. On one of those three substrates, a colloidal crystal layer was formed to obtain an m-plane GaN substrate having the configuration shown in FIG. 5C. As the solute of a colloidal solution, spherical silica nanoparticles SEAHOSTAR™ RE-P10 (produced by Nippon Shokubai Co., Ltd.), which were $SiO_2$ nanoparticles each having a diameter of 100 nm, were used. And the colloidal solution was prepared to be a 2 vol % aqueous solution. The dip coating was carried out at a rate of 2.8 μm/s.

That substrate had no active layers or electrodes, which are essential components to form the structure of a light-emitting element, and its structure was exactly as shown in FIG. 5C. The etching process was carried out for four minutes using an etching system NE-701 (produced by ULVAC, Inc.) under the condition including an antenna power of 320 W, a bias power of 30 W, a chlorine gas flow rate of 50 sccm, and a pressure of 0.5 Pa. As comparative examples, an unevenness structure having a feature size of a few micrometers was formed by photolithographic process on one of the other two substrates, and the other substrate was just mirror-polished without being subjected to any surface treatment at all. Those two comparative examples did not have the structure of the light-emitting element, either.

Figure 15:
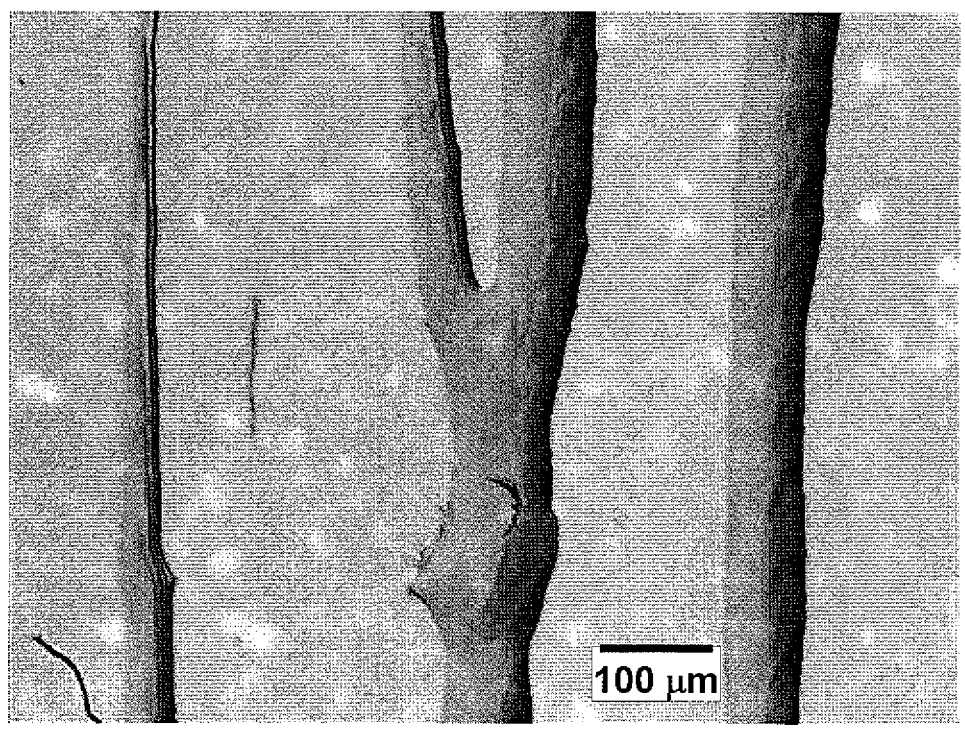
FIG. 15 is a photograph showing a result obtained by subjecting an m-plane GaN substrate, which had not gone through any surface modification process, to the process step of coating its surface with a colloidal crystal layer.
Figure 16A:
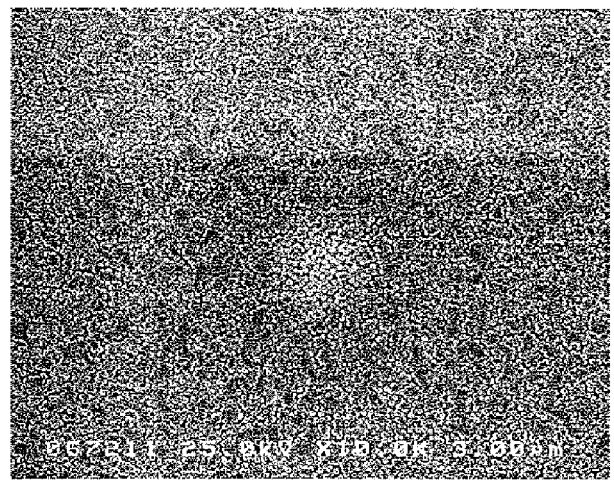
FIG. 16A is a scanning electron microscope (SEM) photograph of a substrate which was obtained by subjecting an m-plane GaN substrate, which had gone through a surface modification process, to the process step of coating its surface with a colloidal crystal layer.

As exemplary preprocessing to cover the m-plane GaN substrate having a colloidal crystal layer, a surface modification process may be carried out using oxygen plasma in order to control the wettability. FIG. 15 is an optical microscope photograph of a substrate which was obtained by subjecting an m-plane GaN substrate, which had not gone through such a surface modification process, to the process step of coating its surface with a colloidal crystal layer. On the other hand, FIG. 16A is a scanning electron microscope (SEM) photograph of a substrate which was obtained by subjecting an m-plane GaN substrate, which had gone through such a surface modification process, to the process step of coating its surface with a colloidal crystal layer. Look at FIG. 15, and it can be confirmed that the colloidal crystal layer got solidified and turned into vertically running stripes. Meanwhile, it can be seen from FIG. 16A that the surface of the m-plane GaN substrate was coated with a single layer in which those nanoparticles were distributed at random. Thus, it can be seen easily that the surface modification process is indispensable for the m-plane GaN substrate. The surface modification process using oxygen plasma was carried out for 30 seconds using a high-density plasma etching system NE-500 (produced by ULVAC, Inc.) generating inductively coupled electric discharge under the condition including an antenna power of 500 W, a bias power of 30 W, an oxygen flow rate of 20 sccm, and a pressure of 0.6 Pa.

Figure 16B:
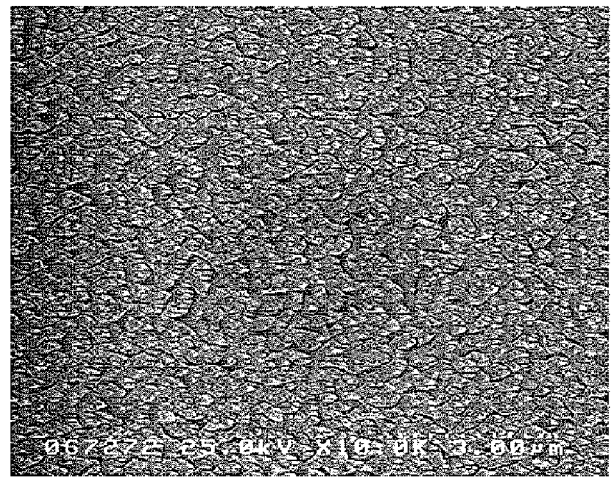
FIG. 16B is a SEM photograph showing the upper surface of the substrate which was obtained by subjecting the m-plane GaN substrate covered with the colloidal crystal layer to a dry etching process.
Figure 16C:
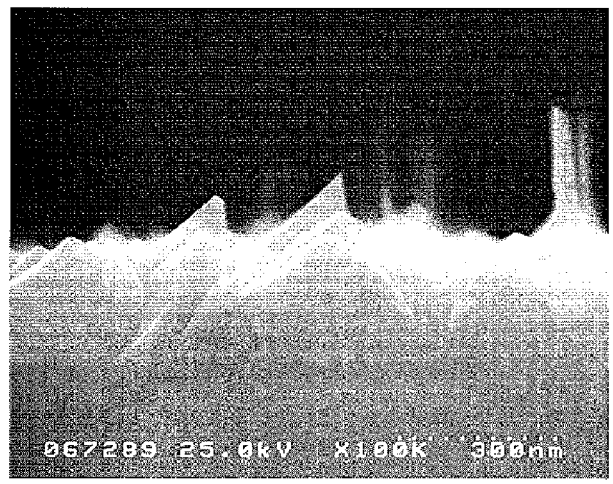
FIG. 16C is a SEM photograph showing a cross section of the substrate which was obtained by subjecting the m-plane GaN substrate covered with the colloidal crystal layer to a dry etching process.

FIGS. 16B and 16C are SEM photographs respectively showing the upper surface and a cross section of the substrate which was obtained by subjecting the m-plane GaN substrate covered with the colloidal crystal layer as shown in FIG. 16A to a dry etching process. It can be seen from FIGS. 16B and 16C that an unevenness structure including a huge number of projections, each having a width of 100 to 300 nm and a height of 200 nm, was formed at random on the surface of the m-plane GaN substrate. It can also be seen from FIG. 16C that there were columnar residues of the etching mask on the unevenness structure. The line and surface roughness values of this unevenness structure were measured using a laser microscope VK-9700 (produced by Keyence Corporation). As a result, the average length RSm of the elements that was obtained from a horizontal distance of 10 μm at an arbitrary position was 0.27 μm and the arithmetic mean roughness Ra obtained from a horizontal area of 10 μm×10 μm at the arbitrary position was 0.02 μm. In this description, the average length RSm of the elements refers herein to the average length of profile curve elements and the arithmetic mean roughness Ra refers herein to the average of the absolute values of the heights as defined by the Japanese Industrial Standard JIS B0601: 2001.

Figure 17:
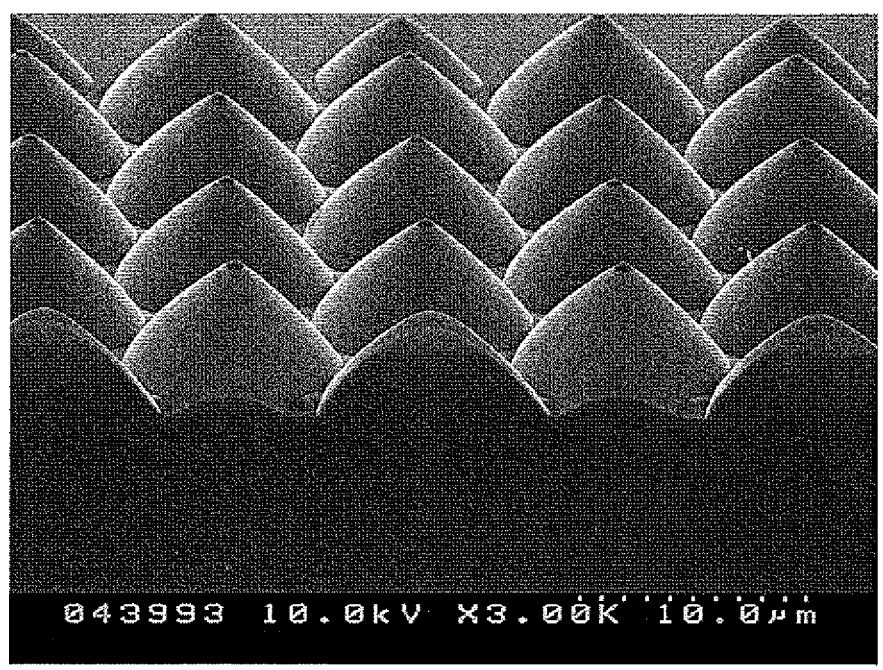
FIG. 17 is a SEM perspective photograph showing hemispherical projections, which had been formed to have a diameter of 10 μm on an m-plane GaN substrate by photolithographic process.

FIG. 17 is a SEM perspective photograph showing hemispherical projections, which had been formed to have a diameter of 10 μm on an m-plane GaN substrate by photolithographic process, as a comparative example. The line and surface roughness values of this unevenness structure were measured using a laser microscope VK-9700 (produced by Keyence Corporation). As a result, the average length RSm of the elements that was obtained from a horizontal distance of 100 μm at an arbitrary position was 11.3 μm and the arithmetic mean roughness Ra obtained from a horizontal area of 100 μm×100 μm at the arbitrary position was 0.62 μm.

These three m-plane GaN substrates which had been prepared in this manner had their reflectance and transmittance measured using an ultraviolet and visible spectrophotometer V-570 (produced by JASCO Corporation) into which an absolute reflectance measuring device ARN-475 (also produced by JASCO Corporation) had been incorporated. The reflectance and transmittance were measured on the mirror polished surface, opposite from the surface having the unevenness structure, using incident light having a wavelength of 450 nm. Particularly, the reflectance was measured only on the surface having the unevenness structure with multiple reflection phenomenon taken into account. The results of the measurements are summarized in the following Table 1:

TABLE 1

|  | Surface having unevenness structure defined by colloidal crystal layer | Surface having unevenness structure formed by photolithography | Mirror surface having no unevenness structure |
|---|---|---|---|
| Reflectance | 4.0% | 14.0% | 18.4% |
| Transmittance | 69.7% | 54.0% | 69.5% |

As can be seen from this Table 1, the reflectance obtained from a mirror surface having no unevenness structure was 18.4%, which matches well the following theoretic equation (2) for calculating the reflectance R:

$$R = \frac{(n_1 - n_2)^2}{(n_1 + n_2)^2} \qquad (2)$$

Thus, it can be seen that this evaluation method is a right method. Next, comparing the reflectance of a surface having the unevenness structure defined by the colloidal crystal layer to that of a surface having the unevenness structure formed by the photolithographic process, it can be seen that the former surface had a reflectance of as low as 4% but the latter surface had a reflectance of 14%, which is almost no different from the reflectance of 18.4% that was obtained from the mirror surface having no unevenness structure. Furthermore, comparing the transmittances obtained from the respective m-plane GaN substrates to each other, it can be seen that the surface having the unevenness structure defined by the colloidal crystal layer and the mirror surface having no unevenness structure both had a transmittance of approximately 70%. That is to say, it turned out that the transmittance hardly changed, no matter whether such an unevenness structure was defined by the colloidal crystal layer or not. On the other hand, only the transmittance obtained from the surface having the unevenness structure formed by photolithography decreased to 54%. Thus, it can be seen that the unevenness structure defined by the colloidal crystal layer according to this embodiment of the present disclosure achieves an advantageous effect of transmitting light that is going to leave the light-emitting element as it is to the external space without reflecting the light at all.

Example 2

The three different unevenness structures formed on m-plane GaN substrates in Example 1 are actually applied to nitride semiconductor light-emitting elements in this Example 2.

As in Example 1 described above, three m-plane GaN substrates were prepared and an n-type nitride semiconductor layer 102, a nitride semiconductor active layer 103 and a p-type nitride semiconductor layer 74 were epitaxially grown on each of the three substrates by performing an MOCVD process under the same condition. Thereafter, a heat treatment was conducted at a temperature of approximately 800 to 900 degrees Celsius for about 20 minutes. Next, the n-type nitride semiconductor layer 72 was selectively dry-etched and exposed, and an n-side electrode 75 was formed on that exposed portion. Subsequently, a p-side electrode 76 was formed on the p-type nitride semiconductor layer 74. Then, as in the first embodiment described above, the n-type GaN substrate 71 was polished to have its thickness reduced. Then, the unevenness structure 60 shown in FIG. 5C was formed on the light extraction surface 50 of the nitride semiconductor light-emitting element 77. On one of those three substrates, the unevenness structure was defined by a colloidal crystal layer. As the solute of a colloidal solution, spherical silica nanoparticles SEAHOSTAR™ KE-P10 (produced by Nippon Shokubai Co., Ltd.), which were $SiO_2$ nanoparticles each having a diameter of 100 nm, were used. And the colloidal solution was prepared to be a 2 vol % aqueous solution. The dip coating was carried out at a rate of 2.8 μm/s. As in Example 1 described above, the colloidal crystal layer thus formed was dry-etched for four minutes using an etching system NE-701 (produced by ULVAC, Inc.) under the condition including an antenna power of 320 W, a bias power of 30 W, a chlorine gas flow rate of 50 sccm, and a pressure of 0.5 Pa. As comparative examples, an unevenness structure including hemispherical projections, each having a diameter of 10 μm, was formed by photolithographic process on one of the other two substrates, and the other substrate was just mirror-polished without forming any unevenness structure on it at all. After the coating member had been removed from its electrodes, the nitride semiconductor light-emitting element 77 was diced into respective chips, each of which was then mounted and bonded onto a circuit board.

The three kinds of nitride semiconductor light-emitting elements thus fabricated had their polarization property evaluated and were subjected to total luminous flux measurement. The results are shown in the following Table 2:

TABLE 2

|  | Light-emitting element having unevenness structure defined by colloidal crystal layer | light-emitting element having unevenness structure formed by photolithography | Light-emitting element having no unevenness structure |
|---|---|---|---|
| Degree of polarization | 0.21 | 0.19 | 0.38 |
| Normalized light extraction efficiency | 1.31 | 1.15 | 1.00 |

As can be seen from the results of degree of polarization measurements shown in Table 2, both the light-emitting element having the unevenness structure defined by the colloidal crystal layer and the light-emitting element having the unevenness structure formed by photolithography had their degree polarization halved, compared to the light-emitting element having no unevenness structure. And it can seen that both of those unevenness structures would contribute effectively to reducing the degree of polarization. Meanwhile, comparing their normalized light extraction efficiencies, the efficiency achieved by the light-emitting element having the unevenness structure formed by photolithography was only 15% higher than the efficiency achieved by the light-emitting element having no unevenness structure. But the efficiency achieved by the light-emitting element having the unevenness structure defined by the colloidal crystal layer was as much as 30% higher than the efficiency achieved by the light-emitting element having no unevenness structure. That is to say, the efficiency was doubled by the light-emitting element having the unevenness structure by the colloidal crystal layer. Consequently, it can be seen that the unevenness structure according to the embodiment of the present disclosure would achieve an advantageous effect.

Figure 18:
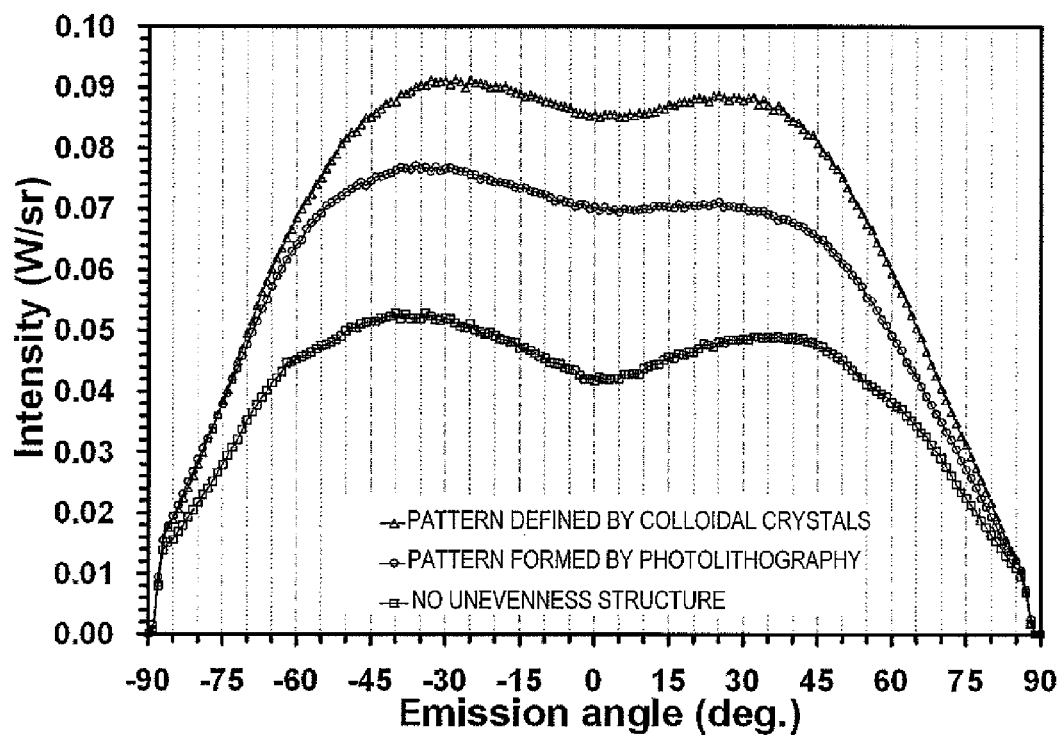
FIG. 18 shows the luminous intensity distributions with the actually measured emission intensities plotted as the ordinates.
Figure 19:
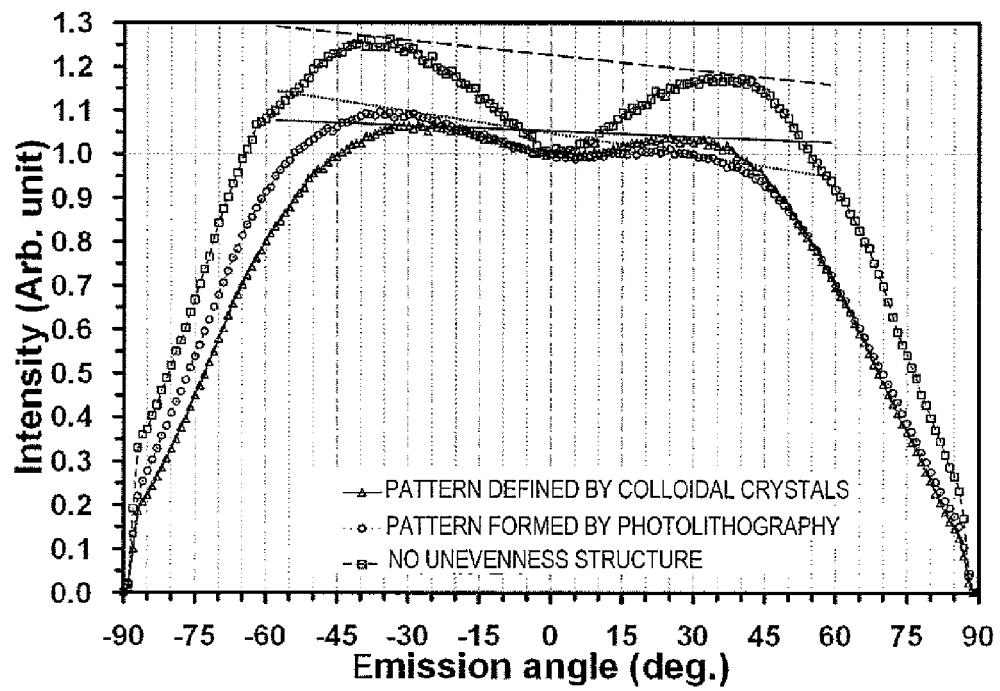
FIG. 19 shows the luminous intensity distributions normalized with an emission intensity at zero degrees.

Furthermore, these three kinds of nitride semiconductor light-emitting elements had their luminous intensity distribution evaluated using a goniometer. The results are shown in FIGS. 18 and 19. Specifically, FIG. 18 shows the luminous intensity distributions with the actually measured emission intensities plotted as the ordinates. FIG. 19 shows the luminous intensity distributions normalized with an emission intensity at zero degrees. As can be seen easily from FIG. 18, the unevenness structure defined by the colloidal crystal layer achieved the highest output and the highest light extraction efficiency. Furthermore, in FIG. 19, paying attention to the gradient of the line that connects together two output peaks in the vicinity of +45 and −45 degrees resulting the extraction of light through a side surface, the line obtained from the unevenness structure defined by the colloidal crystal layer has the gentlest gradient and almost horizontal. Thus, it can be seen that in the light-emitting element having the unevenness structure defined by the colloidal crystal layer, the quantity of the light extracted through its side surface is smaller, and the quantity of the light extracted through its upper surface (i.e., from its unevenness structure) is larger, than any other of those three kinds of elements. If a lot of light can be extracted through the upper surface of a light-emitting element, then a variation in chromaticity can also be minimized when the wavelength is changed using a phosphor. Consequently, it can be seen that the unevenness structure according to this embodiment of the present disclosure would achieve advantageous effects.

Example 3

In this Example 3, it will be described how the unevenness structure according to an embodiment of the present disclosure may be controlled. In this Example 3, $SiO_2$ nanoparticles each having a diameter of 100 nm are also used as in Examples 1 and 2, but the dry etching process time, the structure of the colloidal crystal layer, and the concentration of the colloidal solution were changed from those of Examples 1 and 2. Hereinafter, Example 3 will be described with reference to FIGS. 20A through 22B.

Figure 20A:
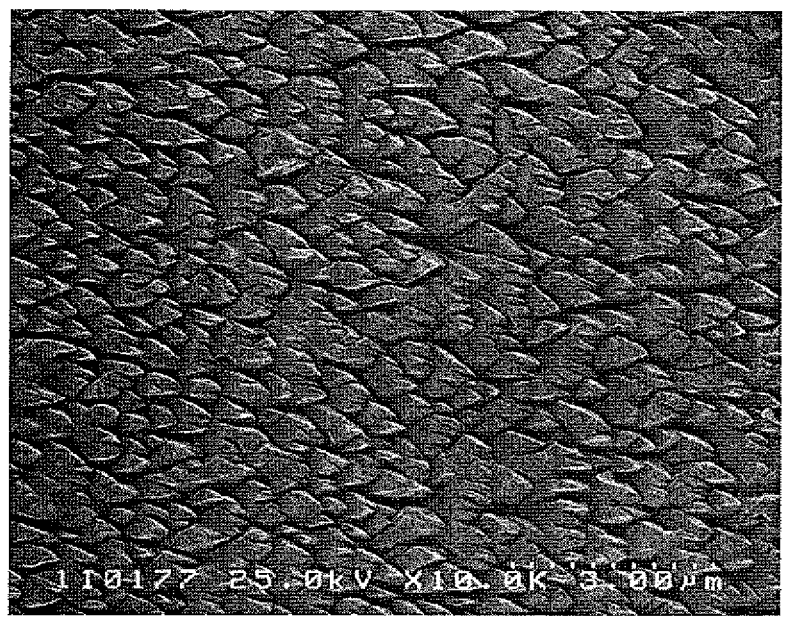
FIG. 20A is a SEM photograph showing the upper surface of the substrate on which the colloidal crystal layer was subjected to a dry etching process for six minutes.
Figure 20B:
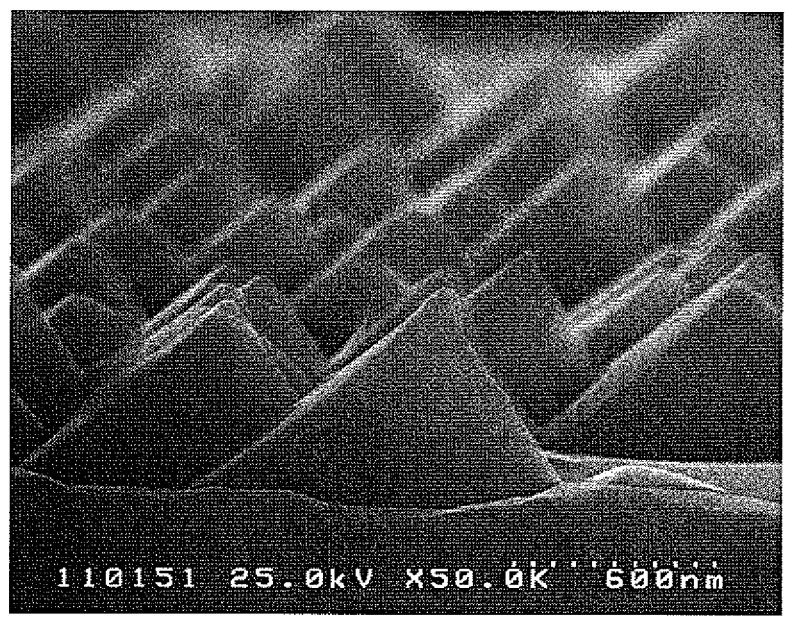
FIG. 20B is a SEM photograph showing a cross section of the substrate on which the colloidal crystal layer was subjected to the dry etching process for six minutes.

First of all, an example in which the dry etching process time was changed will be described. An m-plane GaN substrate, which had been subjected to the surface modification process as in Examples 1 and 2, was prepared. And using spherical silica nanoparticles SEAHOSTAR™ KE-P10 (produced by Nippon Shokubai Co., Ltd.), which were $SiO_2$ nanoparticles each having a diameter of 100 nm, a colloidal solution was prepared to be a 2.0 vol % aqueous solution. The dip coating was carried out at a rate of 2.8 μm/s so as to cover the m-plane GaN substrate with a colloidal crystal layer as in the example shown in FIG. 16A. Next, as in Examples 1 and 2 described above, the colloidal crystal layer thus formed was dry-etched using an etching system NE-701 (produced by ULVAC, Inc.) under the condition including an antenna power of 320 W, a bias power of 30 W, a chlorine gas flow rate of 50 sccm, and a pressure of 0.5 Pa. In this Example 3, however, only the process time was changed into six minutes. The unevenness structure thus obtained is shown in FIGS. 20A and 20B, which are SEM photographs showing respectively the upper surface and a cross section of the substrate on which the colloidal crystal layer was subjected to the dry etching process for six minutes. It can be confirmed that an unevenness structure including a huge number of projections, each having a width of 500 to 900 nm and a height of about 500 nm, was formed at random. The line and surface roughness values of this unevenness structure were measured using a laser microscope VK-9700 (produced by Keyence Corporation). As a result, the average length RSm of the elements that was obtained from a horizontal distance of 10 μm at an arbitrary position was 0.63 μm and the arithmetic mean roughness Ra obtained from a horizontal area of 10 μm×10 μm at the arbitrary position was 0.06 μm. These results reveal that an unevenness structure of a larger size can be obtained by extending the dry etching process time.

Figure 21A:
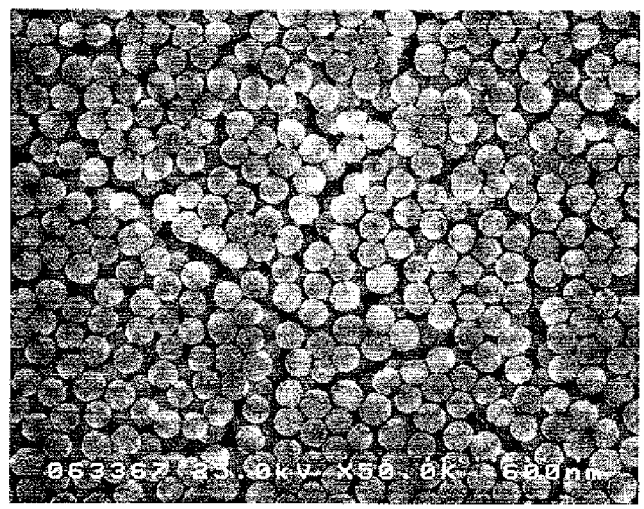
FIG. 21A is a SEM photograph showing a colloidal crystal layer in which two layers of $SiO_2$ nanoparticles having a diameter of 100 nm were stacked one upon the other.
Figure 21B:
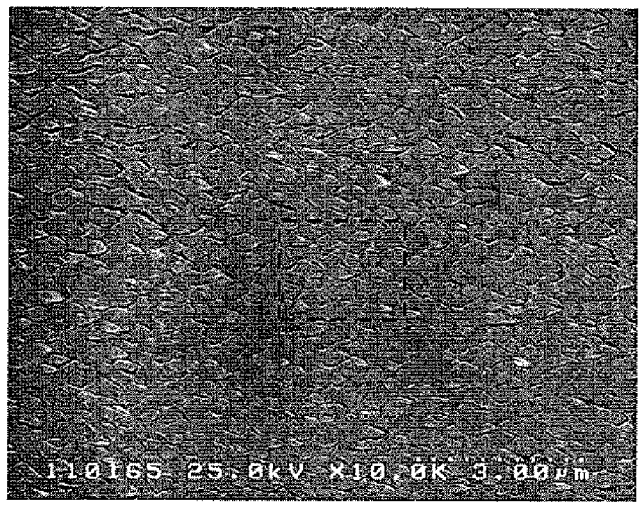
FIG. 21B is a SEM photograph showing the upper surface of the substrate on which the dual colloidal crystal layer was subjected to a dry etching process.
Figure 21C:
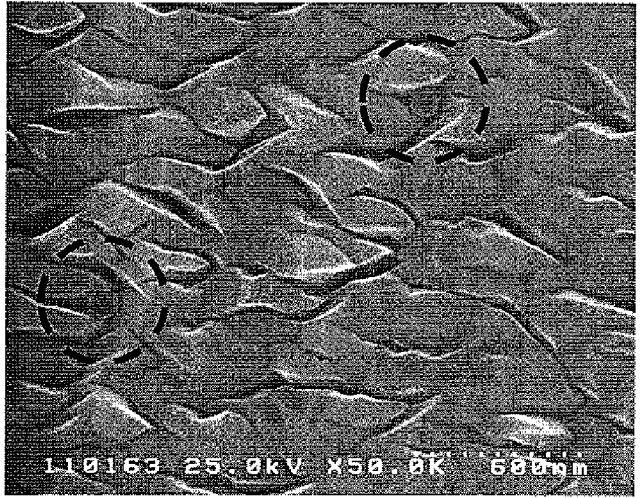
FIG. 21C is a SEM photograph showing, on a larger scale, the upper surface of the substrate on which the dual colloidal crystal layer was subjected to the dry etching process.

Next, an example in which the structure of the colloidal crystal layer was changed will be described. An m-plane GaN substrate, which had been subjected to the surface modification process as in Examples 1 and 2, was prepared. And using spherical silica nanoparticles SEAHOSTAR™ KE-P10 (produced by Nippon Shokubai Co., Ltd.), which were $SiO_2$ nanoparticles each having a diameter of 100 nm, a colloidal solution was prepared to be a 5.0 vol % aqueous solution. The dip coating was carried out at a rate of 1.4 μm/s so as to cover the m-plane GaN substrate with a colloidal crystal layer. FIG. 21A is a SEM photograph showing the colloidal crystal layer thus obtained. As can be seen from FIG. 21A, a colloidal crystal layer, in which two layers of $SiO_2$ nanoparticles each having a diameter of 100 nm were stacked one upon the other, had been formed under the dip coating process condition described above. And such a colloidal crystal layer is quite different from the colloidal crystal layer comprised of nanoparticles that form a single layer as shown in FIG. 16A. Next, as in Examples 1 and 2 described above, the colloidal crystal layer having such a dual-layer structure was dry-etched for 8 minutes using an etching system NE-701 (produced by ULVAC, Inc.) under the condition including an antenna power of 320 W, a bias power of 30 W, a chlorine gas flow rate of 50 sccm, and a pressure of 0.5 Pa. The unevenness structure thus obtained is shown in FIGS. 21B and 21C, which are SEM photographs showing the upper surface of the substrate on which the dual colloidal crystal layer was subjected to the dry etching process. FIG. 21C shows, on a larger scale, a portion indicated by the dashed rectangle in FIG. 21B. It can be confirmed that an unevenness structure including a huge number of projections, each having a width of 100 to 200 nm and a height of about 100 nm, was formed at random in this example. The line and surface roughness values of this unevenness structure were measured using a laser microscope VK-9700 (produced by Keyence Corporation). As a result, the average length RSm of the elements that was obtained from a horizontal distance of 10 μm at an arbitrary position was 0.18 μm and the arithmetic mean roughness Ra obtained from a horizontal area of 10 μm×10 μm at the arbitrary position was 0.01 μm. These results reveal that as the substrate covered with such a dual colloidal crystal layer was exposed to the chlorine plasma in a narrower area, the depressions (i.e., valley portions) of the unevenness structure had their depths reduced, thus forming a pattern having a smaller degree of roughness overall. This is an example that takes advantage of a significant difference between the rate of etching $SiO_2$ using a chlorine plasma (25 nm/min) and the rate of etching GaN using the chlorine plasma (250 nm/min). If a colloidal crystal layer having such a layered structure is used, the chances are much more favorable for the particles that formed the colloidal crystal layer to remain in the resultant unevenness structure. As can be confirmed by the enlarged SEM photograph shown in FIG. 21C, $SiO_2$ nanoparticles each having a diameter of 100 nm, which formed the colloidal crystal layer, remained in the dashed encircled regions shown in FIG. 21C.

Figure 22A:
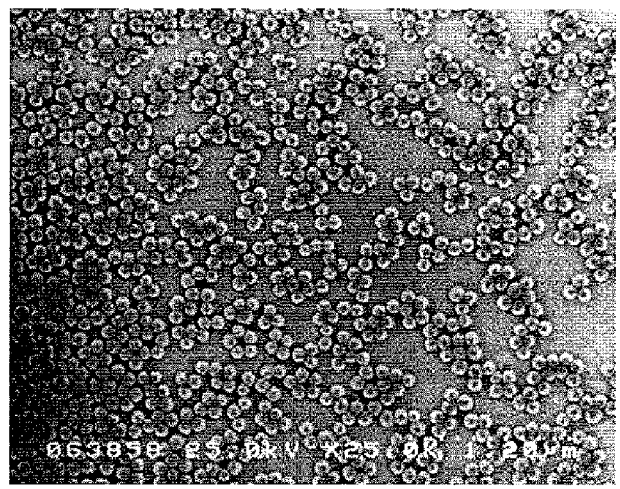
FIG. 22A is a SEM photograph of an m-plane GaN substrate which was covered with a colloidal crystal layer comprised of $SiO_2$ nanoparticles having a diameter of 100 nm.
Figure 22B:
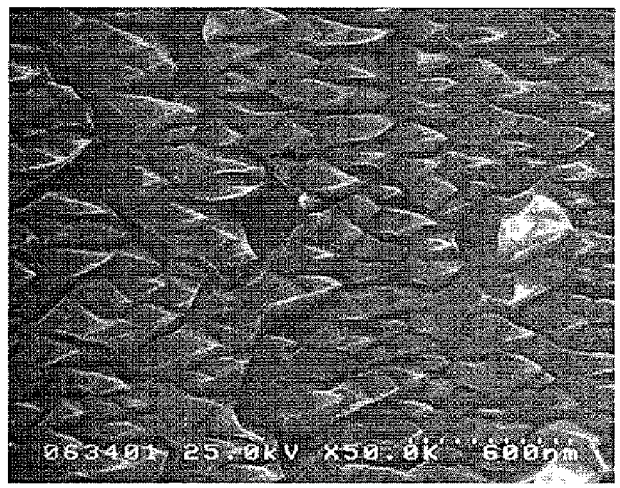
FIG. 22B is a SEM photograph showing the upper surface of the m-plane GaN substrate which was covered with the colloidal crystal layer comprised of $SiO_2$ nanoparticles having a diameter of 100 nm and which was subjected to a dry etching process.
Figure 22C:
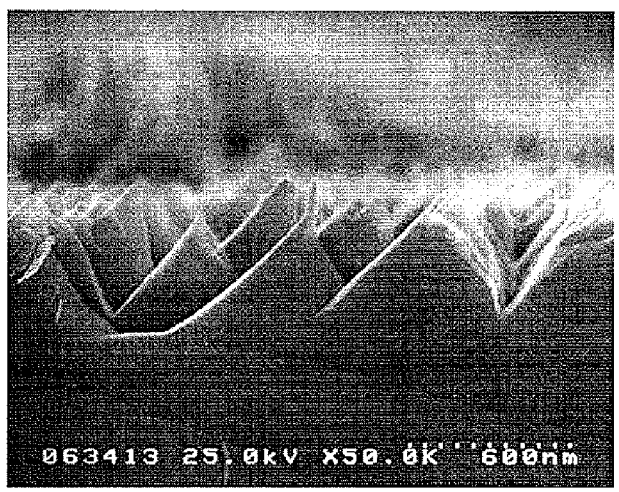
FIG. 22C is a SEM photograph showing a cross section of the m-plane GaN substrate which was covered with the colloidal crystal layer comprised of $SiO_2$ nanoparticles having a diameter of 100 nm and which was subjected to a dry etching process.

Next, an example in which the concentration of the colloidal solution was changed will be described. An m-plane GaN substrate, which had been subjected to the surface modification process as in Examples 1 and 2, was prepared. And using spherical silica nanoparticles SEAHOSTAR™ KE-P10 (produced by Nippon Shokubai Co., Ltd.), which were $SiO_2$ nanoparticles each having a diameter of 100 nm, a colloidal solution was prepared to be a 1.0 vol % aqueous solution. The dip coating was carried out at a rate of 5.6 μm/s so as to cover the m-plane GaN substrate with a colloidal crystal layer. FIG. 22A is a SEM photograph showing the colloidal crystal layer thus obtained. As can be seen from FIG. 22A, under the dip coating process condition described above, the colloidal crystal layer were comprised of sparsely distributed $SiO_2$ nanoparticles each having a diameter of 100 nm, which is quite different from the colloidal crystal layer comprised of densely packed nanoparticles as shown in FIG. 16A. Next, as in Examples 1 and 2 described above, the colloidal crystal layer having such a sparse structure was dry-etched for four minutes using an etching system NE-701 (produced by ULVAC, Inc.) under the condition including an antenna power of 320 W, a bias power of 30 W, a chlorine gas flow rate of 50 sccm, and a pressure of 0.5 Pa. The unevenness structure thus obtained is shown in FIGS. 22B and 22C, which are SEM photographs showing respectively the upper surface and a cross section of the substrate on which the colloidal crystal layer having the sparse structure was subjected to the dry etching process. It can be confirmed that an unevenness structure including a huge number of projections, each having a width of 300 to 600 nm and a height of about 400 nm, was formed at random. The line and surface roughness values of this unevenness structure were measured using a laser microscope VK-9700 (produced by Keyence Corporation). As a result, the average length RSm of the elements that was obtained from a horizontal distance of 10 μm at an arbitrary position was 0.43 μm and the arithmetic mean roughness Ra obtained from a horizontal area of 10 μm×10 μm at the arbitrary position was 0.04 μm. These results reveal that as the substrate covered with such a sparse colloidal crystal layer was exposed to the chlorine plasma in a broader area, the depressions (i.e., valley portions) of the unevenness structure had their depths increased, thus forming a pattern having a larger degree of roughness overall. This is an example that takes advantage of a significant difference between the rate of etching $SiO_2$ using a chlorine plasma (25 nm/min) and the rate of etching GaN using the chlorine plasma (250 nm/min) as in the example described above.

In each of the three examples described above, only a condition for performing an anisotropic dry etching process with a chlorine plasma by using the crystallographic plane orientation of gallium nitride is supposed to be adopted. However, gallium nitride may also be etched isotropically by setting the antenna power to be 320 W, the bias power to be 60 W, the chlorine gas flow rate to 10 sccm, and the pressure to be 0.1 Pa, respectively. If the etching process were carried out under such a condition, however, not just the etch rate of GaN would decrease to approximately a half but also the effect of reducing the degree of polarization as described above would diminish as well.

Example 4

As Example 4, it will be described with reference to FIGS. 23A through 24C how the shape of an unevenness structure that uses a colloidal crystal layer may be controlled with respect to an m-plane GaN substrate.

In this Example 4, two different unevenness structures were formed on two kinds of m-plane GaN substrates, which had been subjected to a surface modification process, by using two different kinds of colloidal solutions. One of the two kinds of colloidal solutions was prepared using, as its solute, spherical silica nanoparticles SEAHOSTAR™ KE-P50 (produced by Nippon Shokubai Co., Ltd.), which were $SiO_2$ nanoparticles each having a diameter of 500 nm, so as to have an aqueous solution concentration of 8.0 vol %. The dip coating was carried out at a rate of 6.0 µm/s. The other kind of colloidal solution was prepared using, as its solute, spherical silica fine particles EPOSTAR™ GP-H100 (produced by Nippon Shokubai Co., Ltd.), which were particles of a benzoguanamine-melamine-formaldehyde condensate each having a diameter of 10 µm, so as to have an aqueous solution concentration of 1.0 vol %. The dip coating was carried out at a rate of 6.0 µm/s.

Figure 23A:
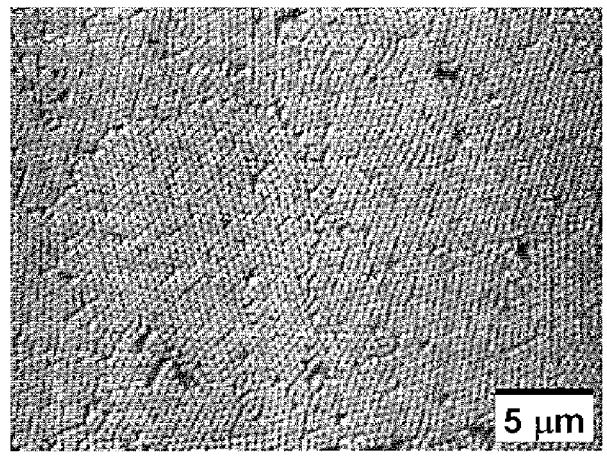
FIG. 23A is an optical microscope photograph of an m-plane GaN substrate which was covered with a colloidal crystal layer comprised of $SiO_2$ nanoparticles each having a diameter of 500 nm.
Figure 23B:
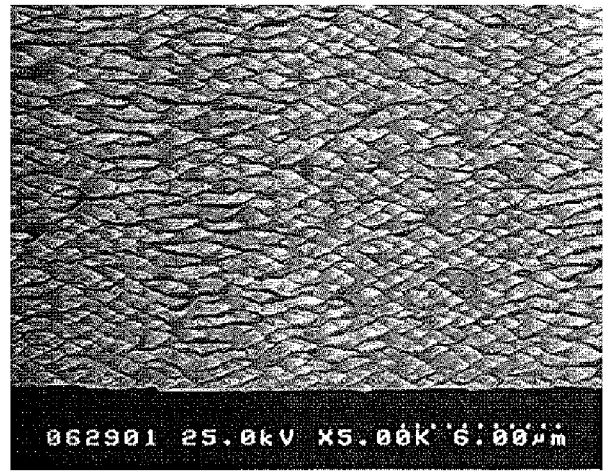
FIG. 23B is a SEM photograph showing the upper surface of the m-plane GaN substrate which was covered with the colloidal crystal layer comprised of $SiO_2$ nanoparticles each having a diameter of 500 nm and which was subjected to a dry etching process.
Figure 23C:
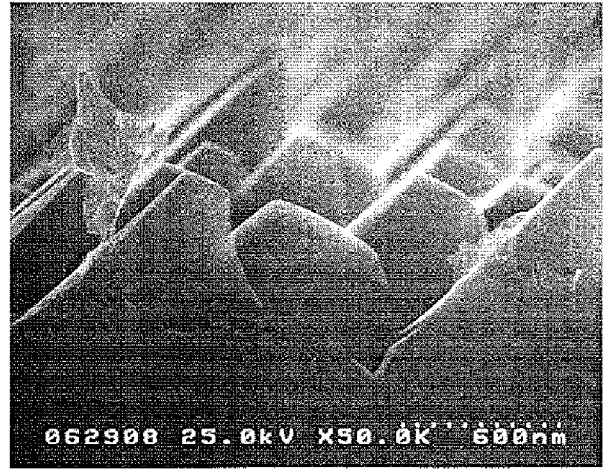
FIG. 23C is a SEM photograph showing a cross section of the m-plane GaN substrate which was covered with the colloidal crystal layer comprised of $SiO_2$ nanoparticles each having a diameter of 500 nm and which was subjected to a dry etching process.

FIG. 23A is an optical microscope photograph showing an m-plane GaN substrate covered with a colloidal crystal layer comprised of $SiO_2$ nanoparticles each having a diameter of 500 nm. FIGS. 23B and 23C are SEM photographs showing respectively the upper surface and a cross section of the en-plane GaN substrate on which the colloidal crystal layer comprised of $SiO_2$ nanoparticles each having a diameter of 500 nm was subjected to a dry etching process for 20 minutes. In this manner, the patterned shape obtained by the dry etching process can also be controlled by varying the particle size, too. It can be seen that an unevenness structure including a huge number of projections, each having a width of 600 to 1000 nm and a height of 600 nm, was formed at random in this example. The line and surface roughness values of this unevenness structure were measured using a laser microscope VK-9700 (produced by Keyence Corporation). As a result, the average length RSm of the elements that was obtained from a horizontal distance of 10 µm at an arbitrary position was 0.74 µm and the arithmetic mean roughness Ra obtained from a horizontal area of 10 µm×10 µm at the arbitrary position was 0.06 µm. In this manner, the shape of the unevenness structure can also be controlled even by the size of the particles that form the colloidal crystal layer.

Figure 24A:
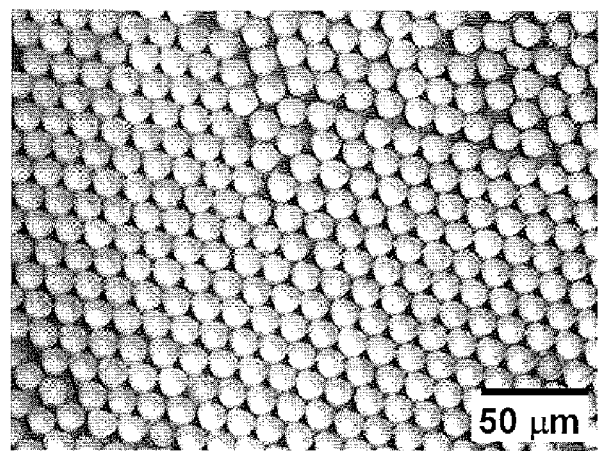
FIG. 24A is an optical microscope photograph of an m-plane GaN substrate which was covered with a colloidal crystal layer comprised of particles of a benzoguanamine-melamine-formaldehyde condensate each having a diameter of 10 μm.
Figure 24B:
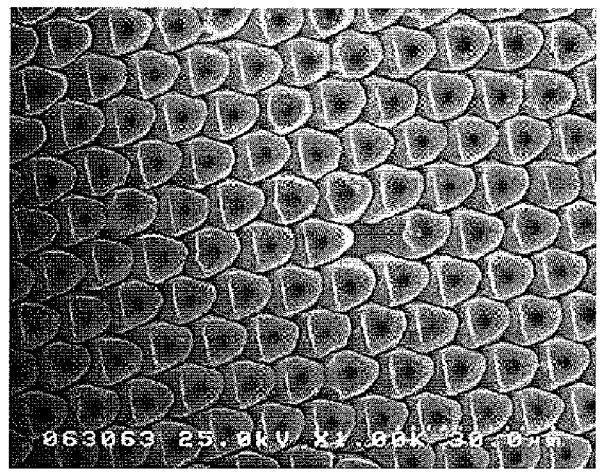
FIG. 24B is a SEM photograph showing the upper surface of the m-plane GaN substrate which was covered with the colloidal crystal layer comprised of particles of a benzoguanamine-melamine-formaldehyde condensate each having a diameter of 10 μm and which was subjected to a dry etching process.
Figure 24C:
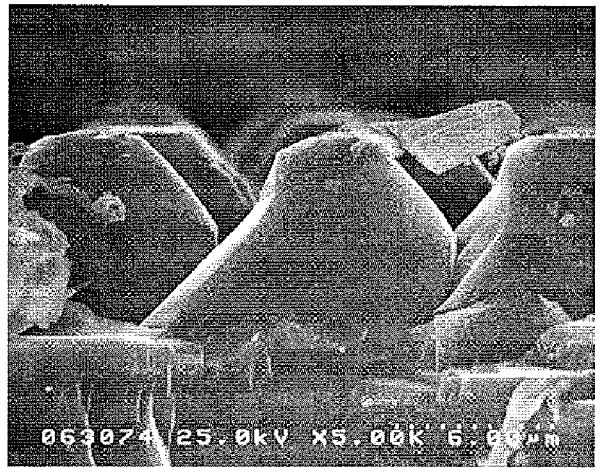
FIG. 24C is a SEM photograph showing a cross section of the m-plane GaN substrate which was covered, with the colloidal crystal layer comprised of particles of a benzoguanamine-melamine-formaldehyde condensate each having a diameter of 10 μm and which was subjected to a dry etching process.

FIG. 24A is an optical microscope photograph showing an m-plane GaN substrate covered with a colloidal crystal layer comprised of particles of a benzoguanamine-melamine-formaldehyde condensate each having a diameter of 10 µm. FIGS. 24B and 24C are SEM photographs showing respectively the upper surface and a cross section of the m-plane GaN substrate on which the colloidal crystal layer comprised of particles of a benzoguanamine-melamine-formaldehyde condensate each having diameter of 10 µm was subjected to a dry etching process for 30 minutes. It can be seen that an unevenness structure including a huge number of projections, each having a width of approximately 12.4 µm and a height of about 8.7 µm, was formed at random on the m-plane GaN substrate in this example. The line and surface roughness values of this unevenness structure were measured using a laser microscope VK-9700 (produced by Keyence Corporation). As a result, the average length RSm of the elements that was obtained from a horizontal distance of 100 µm at an arbitrary position was 12.2 µm and the arithmetic mean roughness Ra obtained from a horizontal area of 100 µm×100 µm at the arbitrary position was 0.78 µm. Consequently, according to an embodiment of the present disclosure, the surface of a nitride semiconductor can be covered with particles each having an arbitrary particle size, irrespective of the size of the particles that are the solute of a colloidal solution.

Comparative Example

Next, a traditional method in which the m-plane GaN substrate is subjected to a wet etching process in an acidic solution as already described in the background section will be described specifically as a comparative example with reference to FIGS. 25A and 25B.

In this comparative example, an m-plane GaN substrate was dipped in a KOH aqueous solution (having a concentration of 50%), which had been heated to 100 degrees Celsius, for 10 minutes and then washed with water to obtain a surface observed image by SEM. FIGS. 25A and 25B are SEM photographs showing respective portions of the m-plane GaN substrate in the vicinity of the −c axis and the +c axis, respectively.

Figure 25A:
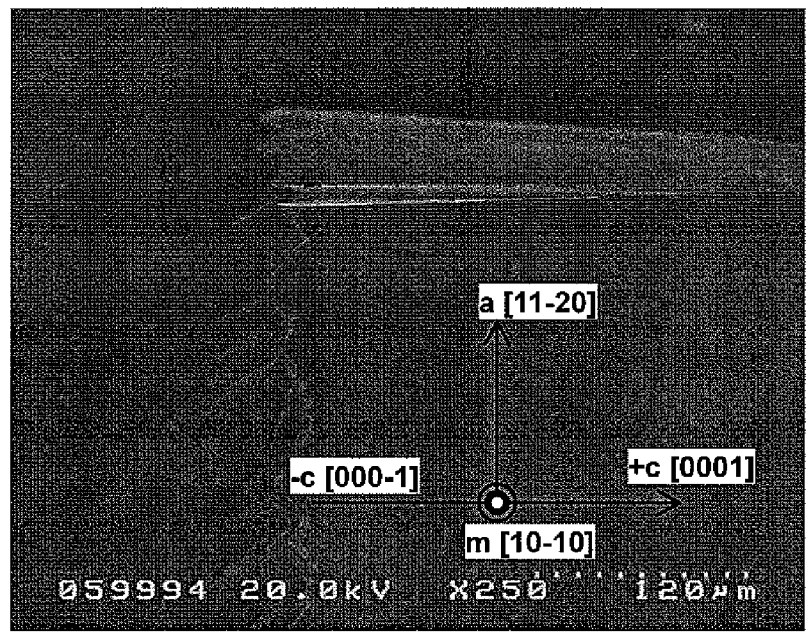
FIG. 25A is a SEM photograph showing a portion of a wet-etched m-plane GaN substrate in the vicinity of the −c axis.
Figure 25B:
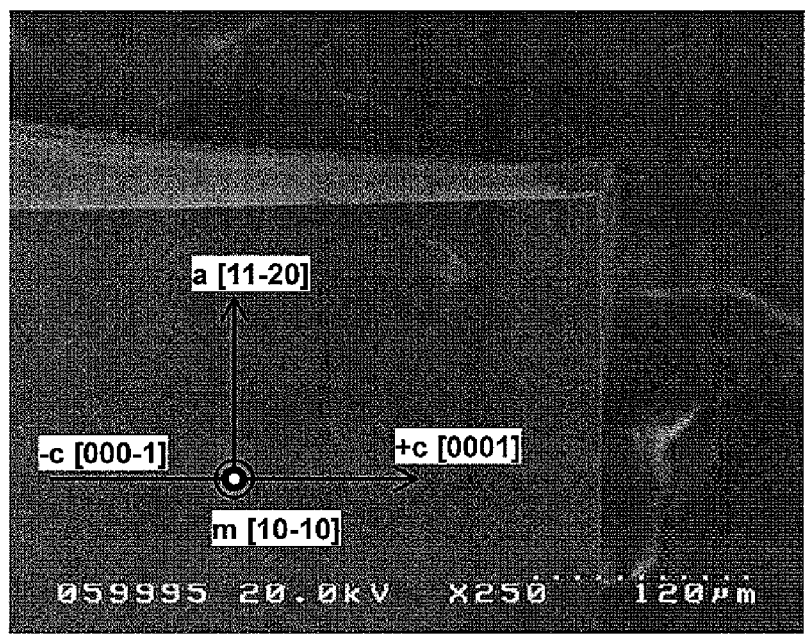
FIG. 25B is a SEM photograph showing a portion of a wet-etched m-plane GaN substrate in the vicinity of the +c axis.

As can be seen from FIGS. 25A and 25B, the side surface of the substrate, as well as its upper surface of m-plane GaN, did not react to KOH at all, but only the −c plane was etched. That is to say, according to an embodiment of the present disclosure, a patterned nanostructure can be formed on a crystal plane other than a c plane in a nitride semiconductor light-emitting element, which has never been done by anybody in the related art.

Other Embodiments

The light-emitting element of the embodiment described above may be used as a light source as it is. However, when combined with a resin including a phosphor to change the wavelength, for example, the light-emitting element of this embodiment can be used effectively as a light source having a broadened wavelength range (e.g., as a white light source).

Figure 26:
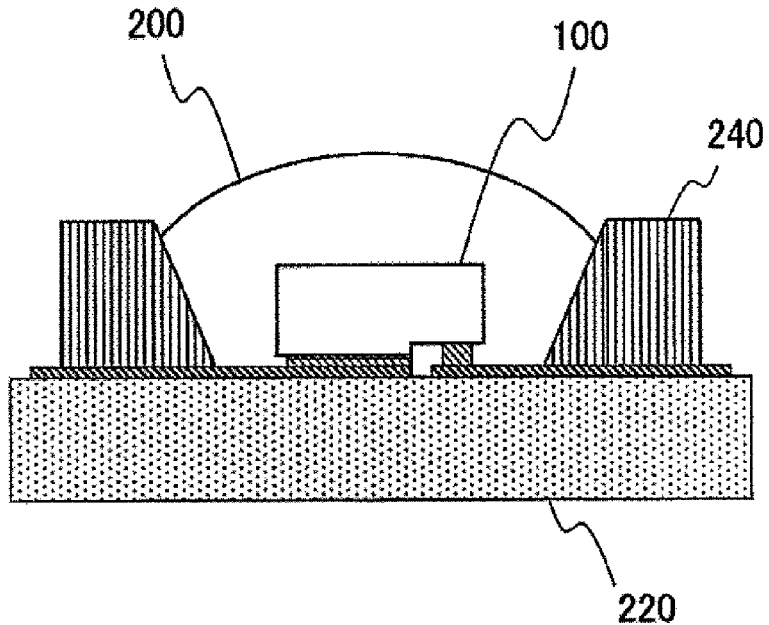
FIG. 26 is a cross-sectional view illustrating an exemplary embodiment of a white light source.

FIG. 26 is a schematic representation illustrating an example of such a white light source. The light source shown in FIG. 26 includes the light-emitting element 100 having a configuration according to any of the embodiments described above and a resin layer 200 in which a phosphor (such as YAG (yttrium aluminum garnet)) to change the wavelength of the light emitted from the light-emitting element 100 into a longer wavelength is dispersed. The light-emitting element 100 has been mounted on a supporting member 220 on which an interconnect pattern has been formed. And on the supporting member 220, a reflective member 240 is arranged so as to surround the light-emitting element 100. The resin layer 200 is arranged to cover the light-emitting element 100.

Figure 27:
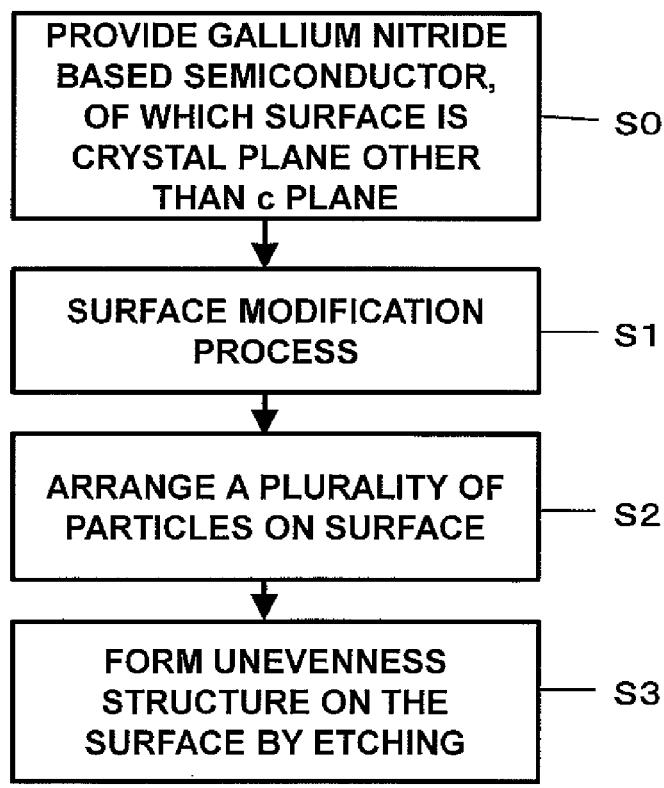
FIG. 27 is a flowchart showing an exemplary procedure of a method of making a surface modified semiconductor according to an exemplary embodiment of the present disclosure.

FIG. 27 is a flowchart showing the procedure of an exemplary unevenness structure forming method according to an embodiment of the present disclosure.

The unevenness structure forming method shown in this flowchart includes the steps of: (S0) providing a gallium nitride based semiconductor, of which the surface is a crystal plane other than a c plane; (S1) modifying the surface; (S2) arranging a plurality of particles on the modified surface; and (S3) forming an unevenness structure on the surface. The average length (RSm) of the roughness curve elements of this unevenness structure is adjusted to fall within the range of 150 nm to 800 nm.

As described above, according to an embodiment of the present disclosure, a light-emitting element, of which the principal surface is a non-polar plane or a semi-polar plane, can have its light extraction efficiency increased, and a semiconductor light-emitting device having a reduced degree of polarization and improved luminous intensity distribution can be provided. In addition, with the semiconductor light-emitting device and its manufacturing method according to an embodiment of the present disclosure, a patterned micro- or nanostructure can be formed at a reduced cost and in a shorter time on the surface of a gallium nitride based semiconductor (GaN-based semiconductor) having a large area. According to this technique, not just can the light extraction efficiency of a GaN based semiconductor light-emitting element, of which the principal surface is either a non-polar plane or a semi-polar plane, be increased but also can a semiconductor light-emitting device, of which the degree of polarization has been reduced and the luminous intensity distribution has been improved, be mass-produced as well.

A gallium nitride based semiconductor light-emitting element, light source and unevenness structure forming method according to embodiments of the present disclosure are applicable to various fields of technologies including display, illumination and optical information processing. An embodiment of the present disclosure may be used as a light-emitting diode or a laser diode that operates at wavelengths over the entire visible radiation range, which covers the ultraviolet, blue, green, orange and white parts of the spectrum. And a light-emitting element according to an embodiment of the present disclosure is expected to be applied to various fields of technologies including display, illumination and optical information processing.

While the present disclosure has been described with respect to preferred embodiments thereof, it will be apparent to those skilled in the art that the disclosed disclosure may be modified in numerous ways and may assume many embodiments other than those specifically described above. Accordingly, it is intended by the appended claims to cover all modifications of the disclosure that fall within the true spirit and scope of the disclosure.

What is claimed is:

1. A method for forming an unevenness structure, the method comprising the steps of:
   (S0) providing a gallium nitride based semiconductor, of which the surface is a crystal plane other than a c plane;
   (S1) covering the surface of the gallium nitride based semiconductor with a colloidal crystal layer composed of colloidal particles which are arranged periodically, after the step (S0) has been performed; and
   (S2) etching the surface of the gallium nitride based semiconductor using the colloidal crystal layer as a mask to form the unevenness structure corresponding to an arrangement pattern of the colloidal particles that form the colloidal crystal layer on the surface of the gallium nitride based semiconductor, after the step (S1) has been performed.

2. The method of claim 1, the method further comprising:
   a step of exposing the surface of the gallium nitride based semiconductor to an oxygen plasma atmosphere between the step (S0) and the step (S1).

3. The method of claim 1, wherein
   the colloidal particles are arranged in a period that is approximately as long as a wavelength of visible radiation.

4. The method of claim 1, wherein
   the colloidal particles are arranged by a self-organizing process in the step (S1).

5. The method of claim 1, wherein
   roughness curve elements of the unevenness structure have an average length (RSm) of 150 nm to 800 nm.

6. The method of claim 1, wherein the step (S1) includes the steps of:
   (S1A) dipping the gallium nitride based semiconductor in a solution including the particles; and
   (S1B) pulling up the gallium nitride based semiconductor from the solution after the step (S1A) has been performed.

7. The method of claim 1, wherein
   each nanoparticle has a size of $10^{-9}$ to $10^{-6}$ m.

8. The method of claim 1, wherein
   the surface of the gallium nitride based semiconductor is an m-plane.

9. The method of claim 1, wherein
   the colloidal particles are made of at least one selected from the group consisting of $SiO_2$, $TiO_2$, ZnO, Au, Ag, polystyrene, a benzoguanamine-melamine-formaldehyde condensate and cross-linked polymethylmethacrylate.

10. The method of claim 1, wherein
    a plurality of projections are formed at random on the surface of the gallium nitride based semiconductor when viewed in a cross-sectional view, after the step (S2) has been performed.

11. The method of claim 6, wherein
    the solution in the step (S1A) is hydrophilic.

12. The method of claim 6, wherein a solvent of the solution is at least one selected from the group consisting of water, methanol, ethanol, phenol, ethylene glycol, and acetic acid.

* * * * *